(12) United States Patent
Miyahara et al.

(10) Patent No.: US 9,887,081 B2
(45) Date of Patent: Feb. 6, 2018

(54) METHOD FOR MANUFACTURING INSULATING FILM LAMINATED STRUCTURE

(71) Applicant: TOKYO ELECTRON LIMITED, Tokyo (JP)

(72) Inventors: Junya Miyahara, Yamanashi (JP); Yutaka Fujino, Yamanashi (JP); Genji Nakamura, Yamanashi (JP); Kentaro Shiraga, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/380,955

(22) Filed: Dec. 15, 2016

(65) Prior Publication Data

US 2017/0170010 A1 Jun. 15, 2017

(30) Foreign Application Priority Data

Dec. 15, 2015 (JP) ................... 2015-244530

(51) Int. Cl.
*H01L 21/02* (2006.01)
*H01L 21/687* (2006.01)
(Continued)

(52) U.S. Cl.
CPC ...... *H01L 21/02236* (2013.01); *C23C 16/403* (2013.01); *C23C 16/405* (2013.01);
(Continued)

(58) Field of Classification Search
CPC ......... H01L 21/02236; H01L 21/02178; H01L 21/022; H01L 21/0234; C23C 16/403; C23C 16/405; C23C 16/4554; C23C 16/56; H01J 37/32192; H01J 37/32211; H01J 37/3222; H01J 37/32238; H01J 37/32247;
(Continued)

(56) References Cited

U.S. PATENT DOCUMENTS 8,988,012 B2 * 3/2015 Yoshikawa ....... H01J 37/32192
315/111.21
2005/0136610 A1 * 6/2005 Kitagawa .......... H01J 37/32935
438/402

(Continued)

FOREIGN PATENT DOCUMENTS

JP 2012-209457 10/2012
JP 2013-161960 8/2013

*Primary Examiner* — Karen Kusumakar

(57) ABSTRACT

A method for manufacturing an insulating film laminated structure includes a step of forming a first high-k film on a semiconductor substrate, a step of processing the semiconductor substrate in a processing chamber of a plasma processing apparatus by using a plasma to form an oxide film on an interface between the semiconductor substrate and the first high-k film, and a step of forming a second high-k film on the first high-k film. A plasma oxidation process is performed by using a plasma of an oxygen-containing gas at a processing temperature of the semiconductor substrate in a range from 20° C. to 145° C. while setting a power density of a total power of microwaves to be within a range from 0.035 kW/m² to 3.5 kW/m² with respect to a total area of a conductive member facing an inner space of the processing chamber and microwave transmitting windows.

18 Claims, 14 Drawing Sheets

(51) Int. Cl.
*C23C 16/40* (2006.01)
*H01J 37/32* (2006.01)
*C23C 16/455* (2006.01)
*C23C 16/56* (2006.01)

(52) U.S. Cl.
CPC .......... *C23C 16/4554* (2013.01); *C23C 16/56* (2013.01); *H01J 37/3222* (2013.01); *H01J 37/32192* (2013.01); *H01J 37/32211* (2013.01); *H01J 37/32238* (2013.01); *H01J 37/32247* (2013.01); *H01J 37/32256* (2013.01); *H01J 37/32311* (2013.01); *H01J 37/32715* (2013.01); *H01L 21/022* (2013.01); *H01L 21/0234* (2013.01); *H01L 21/02178* (2013.01); *H01L 21/687* (2013.01); *H01J 37/3244* (2013.01); *H01J 37/32834* (2013.01); *H01L 21/02181* (2013.01); *H01L 21/02186* (2013.01); *H01L 21/02189* (2013.01); *H01L 21/02192* (2013.01); *H01L 21/02252* (2013.01)

(58) Field of Classification Search
CPC ........... H01J 37/32256; H01J 37/32311; H01J 37/32715
See application file for complete search history.

(56) References Cited

U.S. PATENT DOCUMENTS

2006/0040483 A1* 2/2006 Niimi ................ H01L 21/28185
 438/591
2012/0248583 A1* 10/2012 Kabe ................ H01L 21/02236
 257/632
2014/0065841 A1* 3/2014 Matero ............... H01L 21/0228
 438/778
2014/0342575 A1* 11/2014 Ito ..................... H01L 21/02172
 438/763

* cited by examiner

METHOD FOR MANUFACTURING INSULATING FILM LAMINATED STRUCTURE

CROSS-REFERENCE TO RELATED APPLICATIONS

This application claims priority to Japanese Patent Application No. 2015-244530 filed on Dec. 15, 2015, the entire contents of which is incorporated herein by reference.

FIELD OF THE INVENTION

The disclosure relates to a method for manufacturing an insulating film laminated structure including an oxide film on a target object.

BACKGROUND OF THE INVENTION

A silicon substrate has been widely used as a substrate for electronic device. Recently, however, in order to achieve high mobility in a device such as a CMOS or the like, a substrate material such as an IV group semiconductor, an III-V group semiconductor or the like is used instead of the silicon substrate, and a technique of using as a channel material such a substrate material deposited on a silicon substrate attracts attention. For example, an electron or a hole of Ge that is an IV group semiconductor has higher mobility than that of an electron or a hole in silicon. Therefore, Ge is known as a semiconductor material having excellent electrical characteristics. In addition, in order to reduce an equivalent oxide film thickness (EOT), a high-k film is used as a gate insulating film.

The interface between the Ge substrate and the high-k film has poor electrical characteristics. Therefore, a technique for forming a Ge oxide film between a Ge substrate and a high-k film by using a slot antenna type plasma processing apparatus is suggested in Japanese Patent Application Publication No. 2012-209457.

In addition, Japanese Patent Application Publication No. 2013-161960 suggests a technique for forming a silicon oxide film on a silicon substrate at a low temperature of 100° C. or less by a low-power microwave plasma using a plasma processing apparatus for introducing a plurality of microwaves into a processing chamber through a plurality of microwave transmitting windows.

By forming the Ge oxide film as suggested in the Japanese Patent Application Publication No. 2012-209457, the electrical characteristics of the interface between the Ge substrate and the high-k film can be improved. However, in order to achieve high mobility, a film quality of the Ge oxide film needs to be further improved. In developing a next-generation device, it is expected to form an oxide film having a reduced interface state density with a thickness of 0.3 nm or less between the semiconductor substrate such as Ge and a high-k film. Therefore, there is required a technique capable of forming a thin Ge oxide film at a lower temperature while ensuring high controllability of a film thickness. Further, it is also required to decrease the EOT of the entire gate insulating film including the Ge oxide film.

SUMMARY OF THE INVENTION

In view of the above, the disclosure provides a method for manufacturing an insulating film laminated structure having a small EOT and having a high-quality thin oxide film having a reduced interface state density on a semiconductor substrate.

A method for manufacturing an insulating film laminated structure on a semiconductor substrate, includes: a step A of forming a first high-k film on the semiconductor substrate; a step B of processing the semiconductor substrate in a processing chamber of a plasma processing apparatus by using a plasma to form an oxide film on an interface between the semiconductor substrate and the first high-k film; and a step C of forming a second high-k film on the first high-k film.

In the insulating film laminated structure manufacturing method, the plasma processing apparatus includes: the processing chamber configured to accommodate a semiconductor substrate; a mounting table provided in the processing chamber and configured to mount thereon the semiconductor substrate; a microwave output unit configured to generate microwaves and distribute and output the microwaves to a plurality of channels; an antenna unit configured to introduce the microwaves outputted from the microwave output unit into the processing chamber; a tuner configured to match an impedance between the microwave output unit and the processing chamber; a conductive member provided at an upper portion of the processing chamber and having a plurality of openings facing the mounting table; and a plurality of microwave transmitting windows fitted to the respective openings and configured to allow the microwave to be introduced into the processing chamber therethrough, wherein the plasma is generated by the microwaves introduced into the processing chamber through the respective microwave transmitting windows.

In the insulating film laminated structure manufacturing method of a first aspect, the plasma processing is a plasma oxidation process that is performed by using a plasma of an oxygen-containing gas at a processing temperature of the semiconductor substrate in a range from 20° C. to 145° C. while setting a power density of a total power of the microwaves to be within a range from 0.035 kW/m$^2$ to 3.5 kW/m$^2$ with respect to a total area of the conductive member facing an inner space of the processing chamber and the microwave transmitting windows.

In the insulating film laminated structure manufacturing method of a second aspect, the plasma processing is a plasma nitriding process that is performed by using a plasma of a nitrogen-containing gas at a processing temperature of the semiconductor substrate in a range from 50° C. to 300° C. while setting a power density of a total power of the microwaves to be within a range from 0.7 kW/m$^2$ to 21 kW/m$^2$ with respect to a total area of the conductive member facing an inner space of the processing chamber and the microwave transmitting windows.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings.

First Embodiment

A method for manufacturing an insulating film laminated structure according to a first embodiment will be described with reference to FIGS. 1 to 5 showing main steps of the corresponding method. Here, a case in which a Ge substrate 200 (including a Si substrate on which a Ge film is formed) is used as a semiconductor substrate W (hereinafter, simply referred to as "wafer") for manufacturing semiconductor devices will be described as an example.

Figure 5:
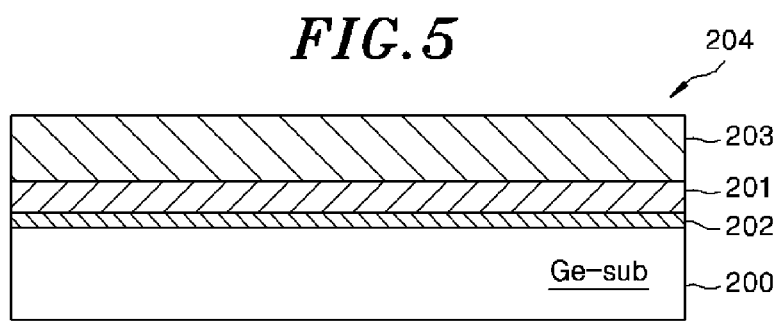

As shown in FIG. 5, an insulating film laminated structure 204 manufactured by the present embodiment includes a Ge substrate 200, a first high-k film 201, a Ge oxide film 202 formed at an interface between the Ge substrate 200 and the first high-k film 201, and a second high-k film 203 formed on the first high-k film 201. The method for manufacturing an insulating film laminated structure of the present embodiment includes the following steps A to C.

(Step A: Formation of first-k film)

Figure 1:
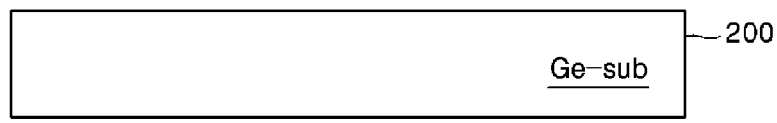
FIGS. 1 to 5 are cross sectional views showing a surface of a semiconductor substrate and its vicinity which explain steps of a method for manufacturing an insulating film laminated structure according to a first embodiment.

First, the Ge substrate 200 is prepared as shown in FIG. 1. The Ge substrate 200 may be of a p-type or an n-type. It is preferable to clean a surface of the Ge substrate 200 by using, e.g., dilute hydrofluoric acid.

Figure 2:
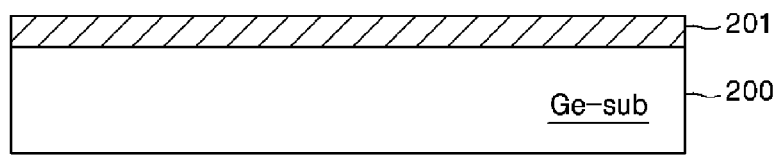

Next, the first high-k film 201 is formed on the Ge substrate 200 as shown in FIG. 2. The high-k film indicates an insulating film having a relative dielectric constant higher than that of a silicon oxide film ($SiO_2$ film; relative dielectric constant of 3.9) and preferably higher than 4. This is also applied to the second high-k film 203.

As for the first high-k film 201, it is preferable to use a film containing aluminum oxide having excellent interface characteristics with the Ge substrate 200. Specifically, the first high-k film 201 may be an $Al_2O_3$ film, yttrium.aluminum composite oxide ($AlOxYn$; x and n being stoichiometric values), or the like. The yttrium.aluminum composite oxide may be, e.g., aluminum yttrium trioxide ($AlO_3Y$), yttrium.aluminum.garnet ($Y_3Al_5O_{12}$), yttrium.aluminum.perovskite (stoichiometric composition $YAlO_3$), or the like. Especially, it is preferable to use an $Al_2O_3$ film as the first high-k film 201.

Although a method for forming a film containing an aluminum oxide is not particularly limited, it is preferable to use, e.g., an ALD (atomic layer deposition) method using trimethyl aluminum and $H_2O$. A thickness of the first high-k film 201 affects oxidation of the interface between the Ge substrate 200 and the first high-k film 201 which is caused by a plasma oxidation process in the following step B. Therefore, it is preferable to set the thickness of the first high-k film 201 to be within a range of, e.g., 0.5 nm to 1.5 nm and more preferably within a range of 0.5 nm to 1.0 nm. When the thickness of the first high-k film 201 is smaller than 0.5 nm, an interface oxidation rate is increased in the following step B and, thus, the film thickness of the Ge oxide film 202 is excessively increased. Accordingly, the controllability of the film thickness in the plasma oxidation process deteriorates. On the other hand, when the film thickness of the first high-k film 201 is greater than 1.5 nm, the interface oxidation rate in the following step B is decreased and, thus, the film thickness of the Ge oxide film 202 is excessively decreased. Accordingly, the controllability of the film thickness in the plasma oxidation process deteriorates.

(Step B: Formation of Ge Oxide Film by Plasma Oxidation Process)

Figure 3:
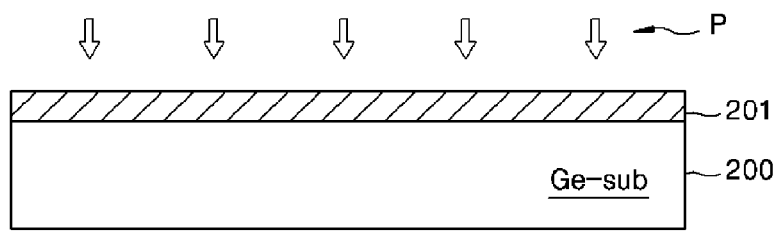

As shown in FIG. 3, the plasma oxidation process is performed on the wafer W and Ge at the interface between the Ge substrate 200 and the first high-k film 201 is oxidized. In this step, a plasma processing apparatus to be described later is used and a low-power low-temperature plasma P is used. Thus, oxidation active species reach the Ge substrate 200 through the first high-k film 201, and the interface portion between the Ge substrate 200 and the first high-k film 201 is oxidized very thinly. The plasma processing apparatus used in this step and the plasma oxidation process will be described in detail later.

Figure 4:
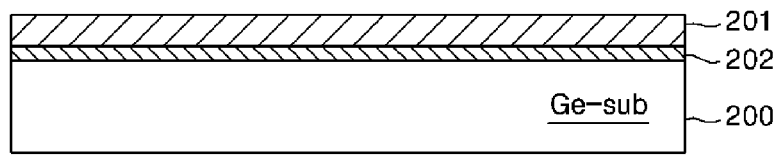

As shown in FIG. 4, the Ge oxide film 202 is formed at the interface between the Ge substrate 200 and the first high-k film 201 by the plasma oxidation process. A thickness of the Ge oxide film 202 is smaller than or equal to, e.g., 1.0 nm and preferably within a range from 0.1 nm to 1.0 nm. By setting the thickness of the Ge oxide film 202 to be smaller than or equal to 0.3 nm, it is possible to reduce an interface state density while suppressing increase in the EOT. Due to the Ge oxide film 202 formed at the interface between the Ge substrate 200 and the first high-k film 201, electrical characteristics of the interface between the Ge substrate 200 and the first high-k film 201 are improved.

(Step C: Formation of Second High-k Film)

As shown in FIG. 5, the second high-k film 203 is formed on the first high-k film 201. The second high-k film 203 may be made of, e.g., $Al_2O_3$, $HfO_2$, $ZrO_2$, $TiO_2$, a rare earth oxide, or the like. The rare earth oxide may be, e.g., $Y_2O_3$, $La_2O_3$, or the like. Although a method for forming the second high-k film 203 is not particularly limited, it is preferable to use, e.g., an ALD (atomic layer deposition) method. The method for forming the first-k film 201 is also used for forming an $Al_2O_3$ film as the second high-k film 203.

In the case of using the insulating film laminated structure 204 as a gate insulating film of a transistor, a thickness of the second high-k film 203 is preferably within a range from, e.g., 1 nm to 3 nm, in order to appropriately control the EOT while suppressing the gate leakage current. When the thickness of the second high-k film 203 is smaller than 1 nm, it is difficult to reduce the leakage current. When the thickness of the second high-k film 203 is greater than 3 nm, a physical film thickness is increased, which makes it difficult to realize miniaturization.

(Exemplary Configuration of Plasma Processing Apparatus)

Figure 6:
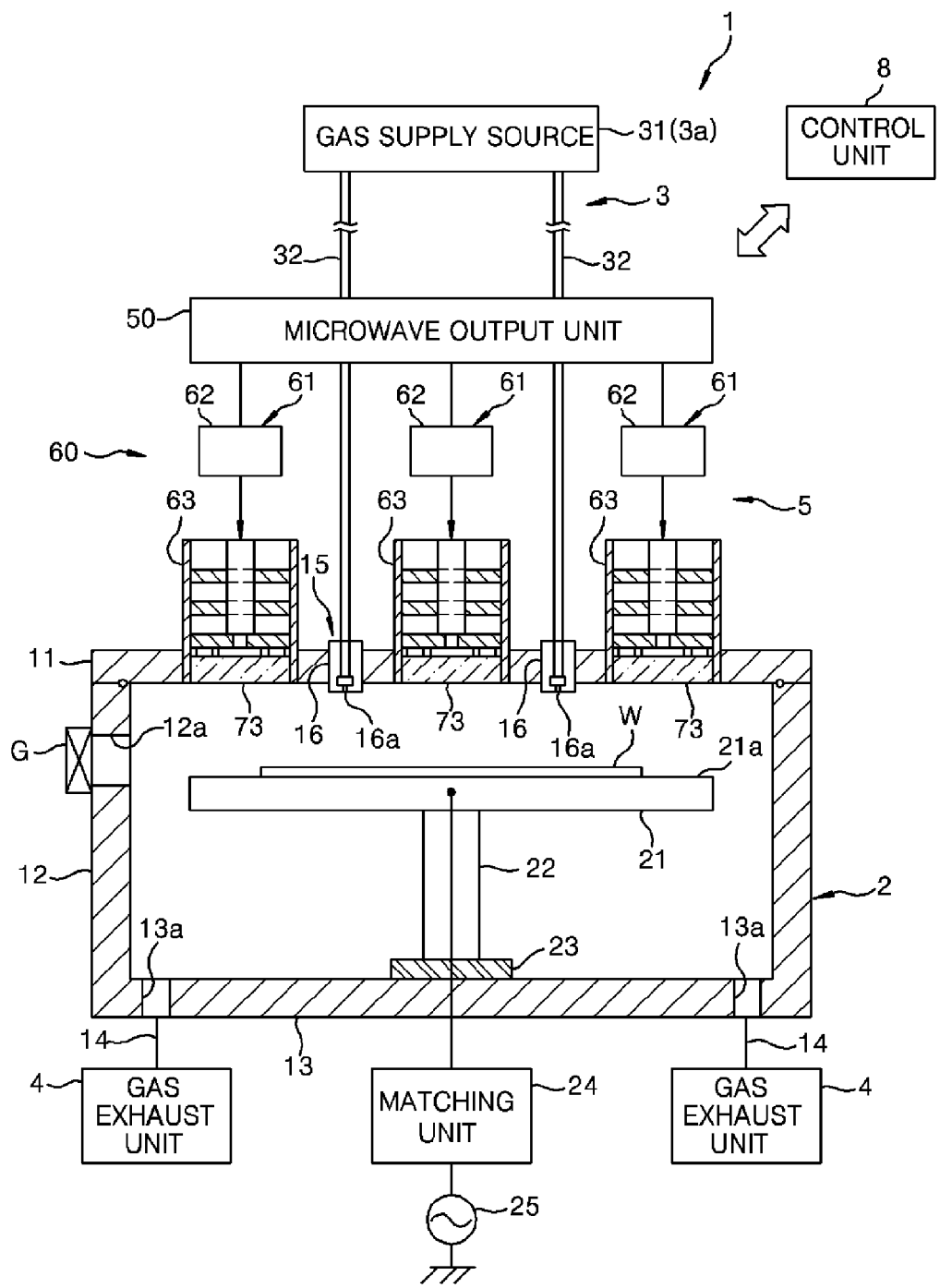
FIG. 6 is a cross sectional view showing a schematic configuration of a plasma processing apparatus used in an embodiment.
Figure 7:
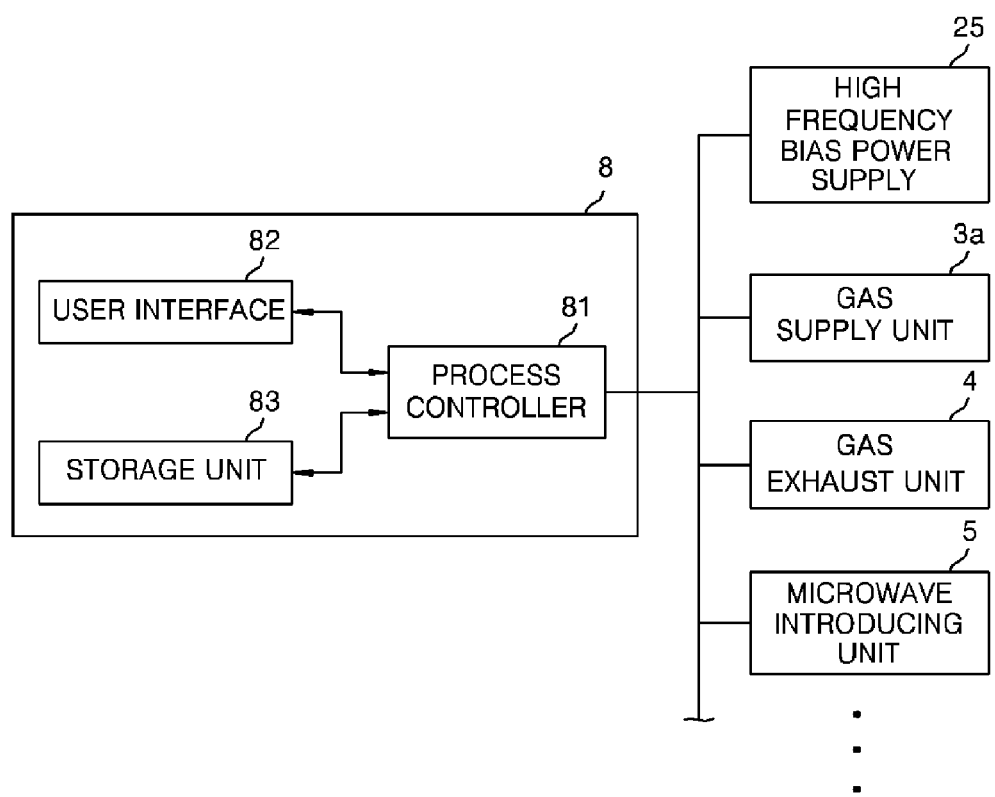
FIG. 7 is a view for explaining a configuration of a control unit shown in FIG. 6.

Hereinafter, an exemplary configuration of a plasma processing apparatus used for the plasma oxidation process of the step B will be described with reference to FIGS. 6 to 13. FIG. 6 is a cross sectional view showing a schematic configuration of the plasma processing apparatus. FIG. 7 is a view for explaining a configuration of a control unit shown in FIG. 6. A plasma processing apparatus 1 used in the present embodiment performs a film forming process such as a plasma oxidation process, a plasma nitriding process or the like on a wafer W by performing a plurality of consecutive operations.

The plasma processing apparatus 1 includes: a processing chamber 2 for accommodating a wafer W as a target object; a mounting table 21 provided in the processing chamber 2 and having a mounting surface 21a for mounting thereon the wafer W; a gas supply unit 3 for supplying a gas into the processing chamber 2; a gas exhaust unit 4 for depressurizing an inside of the processing chamber 2; a microwave introducing unit 5 for producing a microwave for generating a plasma in the processing chamber 2 and introducing a microwave into the processing chamber 2; and a control unit 8 for controlling the respective components of the plasma processing apparatus 1. As for a unit for supplying a gas into the processing chamber 2, an external gas supply unit that is not included in the configuration of the plasma processing apparatus 1 may be used instead of the gas supply mechanism 3.

The processing chamber 2 has, e.g., a substantially cylindrical shape. The processing chamber 2 is made of a metal, e.g., aluminum, aluminum alloy or the like. The microwave introducing unit 5 is provided at an upper portion of the processing chamber 2 and serves as a plasma generation unit configured to generate a plasma by introducing an electromagnetic wave (microwave) into the processing chamber 2. A configuration of the microwave introducing unit 5 will be described in detail later.

The processing chamber 2 has a plate-shaped ceiling portion 11, a plate-shaped bottom portion 13, and sidewall 12 that connects the ceiling portion 11 and the bottom portion 13. The ceiling portion 11 has a plurality of openings. The sidewall 12 has a loading/unloading port 12a through which the wafer W is loaded/unloaded from/to a transfer chamber (not shown) adjacent to the processing chamber 2. A gate valve G is provided between the processing chamber 2 and the transfer chamber. The gate valve G has a function of opening/closing the loading/unloading port 12a. When the gate valve G is closed, the processing chamber 2 is airtightly sealed. When the gate valve G is opened, the wafer W can be transferred between the processing chamber 2 and the transfer chamber.

The bottom portion 13 has a plurality of (two in FIG. 6) gas exhaust ports 13a. The plasma processing apparatus 1 further includes a gas exhaust line 14 that connects the gas exhaust ports 13a and the gas exhaust unit 4. The gas exhaust unit 4 has an APC (automatic pressure control) valve and a high-speed vacuum pump capable of depressurizing an inner space of the processing chamber 2 to a predetermined vacuum level at a high speed. The high-speed vacuum pump may be, e.g., a turbo molecular pump or the like. By operating the high-speed vacuum pump of the gas exhaust unit 4, the inner space of the processing chamber 2 is depressurized to the predetermined vacuum level, e.g., 0.133 Pa.

The plasma processing apparatus 1 further includes a supporting member 22 for supporting the mounting table 21 in the processing chamber 2, and an insulating member 23 made of an insulating material and provided between the supporting member 22 and the bottom portion 13 of the processing chamber 21. The mounting table 21 horizontally mounts thereon the wafer W as a target object. The supporting member 22 has a cylindrical shape extending from a center of the bottom portion 13 toward the inner space of the processing chamber 2. The mounting table 21 and the supporting member 22 are made of, e.g., AlN or the like.

The plasma processing apparatus 1 includes a high frequency bias power supply 25 for supplying a high frequency power to the mounting table 21, and a matching unit 24 provided between the mounting table 21 and the high frequency bias power supply 25. The high frequency bias power supply 25 supplies a high frequency power to the mounting table 21 to attract ions to the wafer W.

Although it is not illustrated, the plasma processing apparatus 1 further includes a temperature control unit for heating or cooling the mounting table 21. The temperature control unit controls a temperature of the wafer W within a range from, e.g., 20° C. (room temperature) to 900° C. The mounting table 21 has a plurality of support pins capable of projecting/retreating with respect to the mounting surface 21a. The support pins are configured to be vertically displaced by an elevation mechanism to perform transfer of the wafer W to and from a transfer unit (not shown) at a raised position.

The plasma processing apparatus 1 further includes a gas inlet unit 15 provided at the ceiling portion 11 of the processing chamber 2. The gas inlet unit 15 has a plurality of cylindrical nozzles 16. A gas hole 16a is formed at a bottom surface of each of the nozzle 16. The arrangement of the nozzles 16 will be described later.

The gas supply mechanism 3 includes a gas supply unit 3a having a gas supply source 31, and a line 32 that connects the gas supply source 31 and the gas inlet unit 15. In FIG. 6, a single gas supply source 31 is illustrated. However, the gas supply unit 3a may have a plurality of gas supply sources depending on types of gases to be used.

The gas supply source 31 is used as a gas supply source of, e.g., a rare gas for plasma generation, a processing gas used for an oxidation process or a nitriding process, or the like. The rare gas for plasma generation may be, e.g., Ar, Kr, Xe, He or the like. As for the processing gas used for the oxidation process, an oxygen-containing gas, e.g., oxygen gas, ozone gas or the like, is used. As for the processing gas used for the nitriding gas, a nitrogen-containing gas, e.g., nitrogen gas, ammonia gas or the like, is used. The rare gas may be used together with the processing gas for oxidation or the processing gas for nitriding.

Although it is not illustrated, the gas supply unit 3a includes a mass flow controller and an opening/closing valve which are provided in the line 32. Types or flow rates of the gases to be supplied into the processing chamber 2 are controlled by the mass flow controller and the opening/closing valve.

The components of the plasma processing apparatus 1 are connected to and controlled by the control unit 8. The control unit 8 is typically a computer. In the example shown in FIG. 7, the control unit 8 includes a process controller 81 having a CPU, and a user interface 82 and a storage unit 83 which are connected to the process controller 81.

The process controller 81 is a control device for integrally controlling the components (e.g., the high frequency bias power supply 25, the gas supply unit 3a, the gas exhaust unit 4, the microwave introducing unit 5 or the and the like) of the plasma processing apparatus 1 which are related to process conditions such as a temperature, a pressure, a gas flow rate, a high frequency power for bias application, a microwave output, and the like.

The user interface 82 includes a keyboard or a touch panel through which an operation manager inputs commands or the like to manage the plasma processing apparatus 1, a display for visually displaying an operation state of the plasma processing apparatus 1, and the like.

The storage unit 83 stores therein a control program (software) for realizing various processes performed in the plasma processing apparatus 1 under the control of the process controller 81, a recipe including stores processing condition data, and the like. A control program or a recipe is retrieved from the storage unit 83 to be executed by the process controller 81, if necessary, in response to an instruction from the user interface 82 or the like. Accordingly, a desired process is performed in the processing chamber 2 of the plasma processing apparatus 1 under the control of the process controller 81.

The control program or the recipe may be stored in a computer-readable storage medium, e.g., a CD-ROM, a hard disk, a flexible disk, a flash memory, a DVD, a Blu-ray disc or the like. Alternatively, the recipe may be transmitted on-line from another apparatus through, e.g., a dedicated line whenever necessary.

Figure 8:
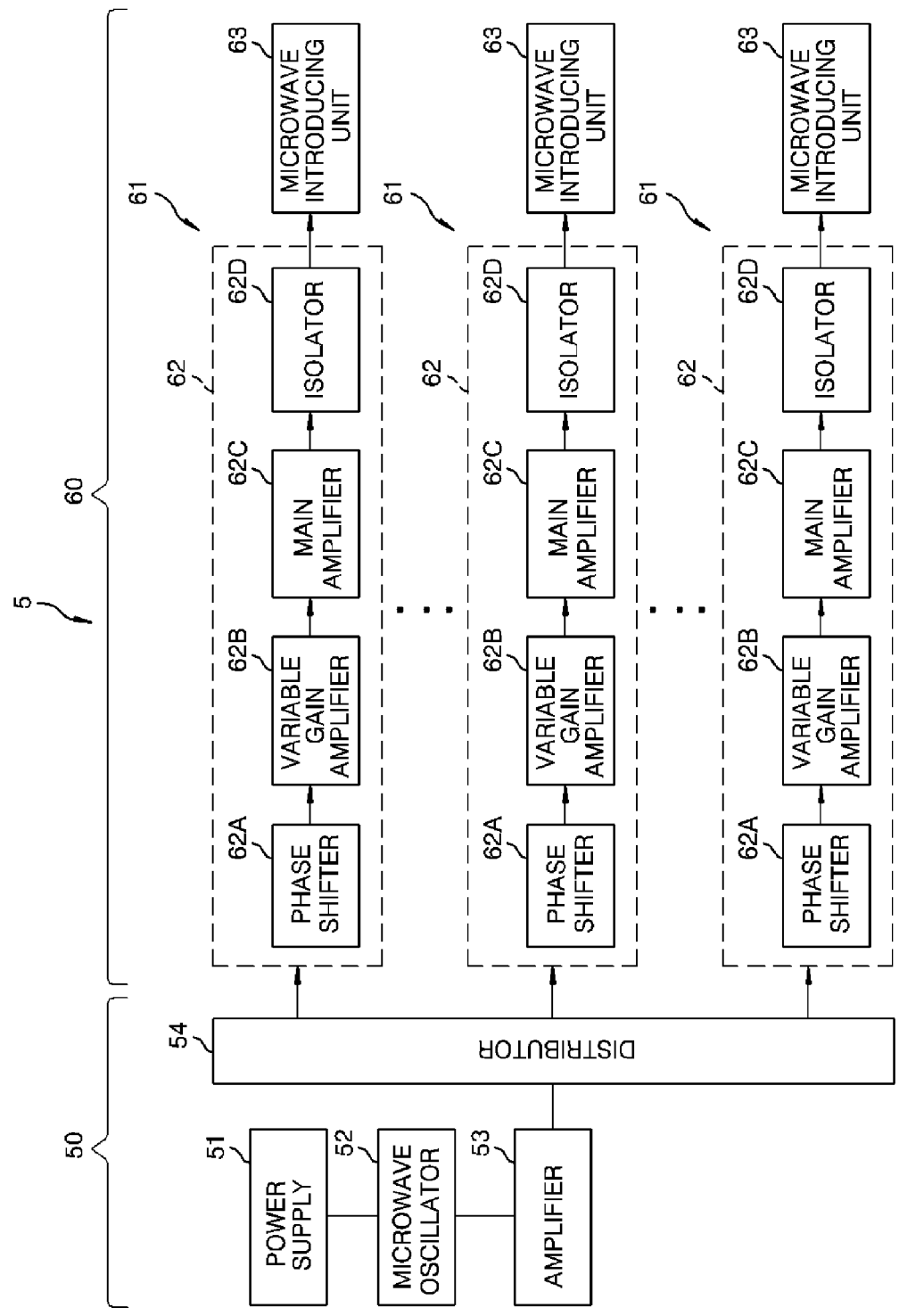
FIG. 8 explains a configuration of a microwave introducing unit shown in FIG. 6.
Figure 9:
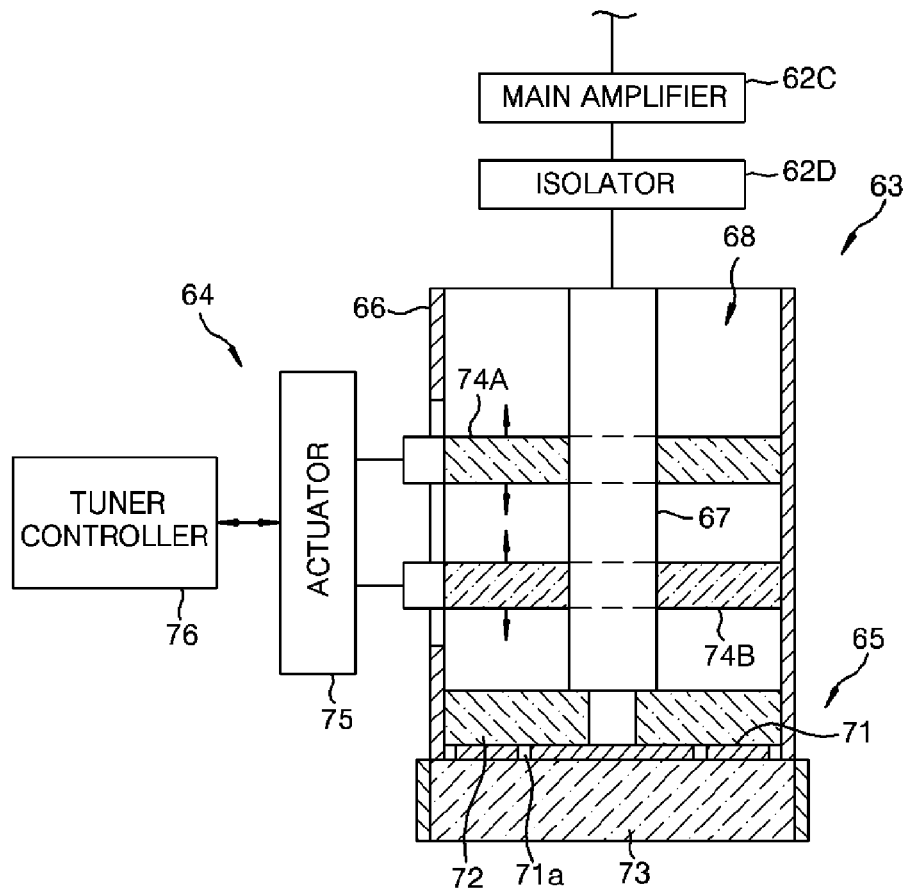
FIG. 9 is a cross sectional view of the microwave introducing unit shown in FIG. 8.
Figure 10:
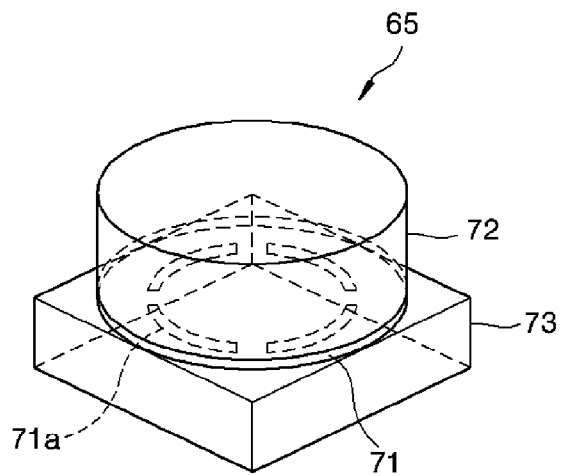
FIG. 10 is a perspective view of an antenna section of the microwave introducing unit shown in FIG. 9.
Figure 11:
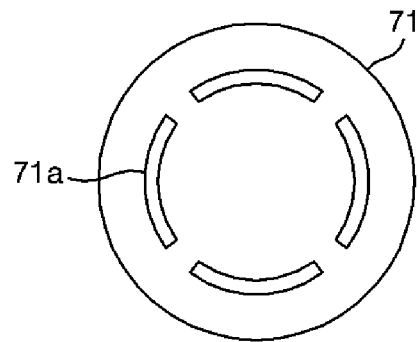
FIG. 11 is a top view of a planar antenna of the microwave introducing unit shown in FIG. 9.

Hereinafter, the configuration of the microwave introducing unit 5 will be described in detail with reference to FIGS. 6 and 8 to 11. FIG. 8 explains a configuration of the microwave introducing unit 5. FIG. 9 is a cross sectional view of the microwave introducing unit shown in FIG. 8. FIG. 10 is a perspective view of an antenna section of the microwave introducing unit shown in FIG. 9. FIG. 11 is a top view of a planar antenna of the microwave introducing unit shown in FIG. 9.

As described above, the microwave introducing unit 5 is provided at the upper portion of the processing chamber 2 and serves as a plasma generation unit for generating a plasma by introducing an electromagnetic wave (microwave) into the processing chamber 2. As shown in FIGS. 6 and 8, the microwave introducing unit 5 includes: a ceiling portion 11 that is a conductive member having a plurality of openings and provided at an upper portion of the processing chamber 2; a microwave output unit 50 for generating a microwave and distributing and outputting the microwave to a plurality of channels, and an antenna unit 60 for guiding the microwaves outputted from the microwave output unit 50. In the present embodiment, the ceiling portion 11 of the processing chamber 2 serves as a conductive member of the microwave introducing unit 5.

The microwave output unit 50 includes a power supply 51, a microwave oscillator 52, an amplifier 53 for amplifying the microwave oscillated by the microwave oscillator 52, and a distributor 54 for distributing the microwave amplified by the amplifier 53 to a plurality of channels. The microwave oscillator 52 oscillates the microwave at a predetermined frequency (e.g., 860 MHz) by using PLL (phase-locked loop). The frequency of the microwave is not limited to 860 MHz and may be 2.45 GHz, 8.35 GHz, 5.8 GHz, 1.98 GHz or the like. The distributor 54 distributes the microwave while matching an impedance between an input side and an output side.

The antenna unit 60 includes a plurality of antenna modules 61. The respective antenna modules 61 guide the microwaves distributed by the distributor 54 into the processing chamber 2. In the present embodiment, the antenna modules 61 have the same configuration. Each of the antenna modules 61 has an amplifier unit 62 for mainly amplifying the distributed microwave and a microwave introducing unit 63 for introducing the microwave outputted from the amplifier 62 into the processing chamber 2.

The amplifier unit 62 has a phase shifter 62A for shifting a phase of a microwave, a main amplifier 62C constituting a solid state amplifier, a variable gain amplifier 62B for controlling a power level of a microwave inputted into the main amplifier 62C, and an isolator 62D for isolating a microwave reflected from an antenna section of the microwave introducing unit 63 to be described later toward the main amplifier 62C.

As shown in FIG. 6, the microwave introducing units 63 are provided at the ceiling portion 11. As shown in FIG. 9, the microwave introducing unit 63 includes a tuner 64 for matching an impedance, an antenna section 65 for emitting the amplified microwave into the processing chamber 2, a cylindrical main body 66 made of a metal and extending in a vertical direction in FIG. 9, and an inner conductor 67 extending in the main body 66 in the same direction as the extension direction of the main body 66. The main body 66 and the inner conductor 67 constitute a coaxial tube. The main body 66 serves as an outer conductor of the coaxial tube. The inner conductor 67 has a rod shape or a tubular shape. A space between an inner peripheral surface of the main body 66 and an outer peripheral surface of the inner conductor 67 serves as a microwave transmission line.

The antenna section 65 is provided at a portion of the main body 66 which is close to the processing chamber 2.

As shown in FIGS. 9 and 10, the antenna section 65 includes a planar antenna 71 connected to a lower end portion of the inner conductor 67, a microwave retardation member 72 provided on a top surface of the planar antenna 71, and a microwave transmitting plate 73 provided at a bottom surface of the planar antenna 71. A bottom surface of the microwave transmitting plate 73 is exposed to the inner space of the processing chamber 2. The microwave transmitting plate 73 is fitted to an opening of the ceiling portion 11 that is the conductive member of the microwave introducing unit 5 through the main body 66. The microwave transmitting plate 73 corresponds to the microwave transmitting window of the present disclosure.

The planar antenna 71 has a circular plate shape. The planar antenna 71 has slots 71a penetrating therethrough. In the examples shown in FIGS. 10 and 11, four circular arc-shaped slots 71a are uniformly arranged. The number of the slots 71a is not limited to four and may be equal to or more than five. Or, the number of the slots 71a may be one, two or three.

The microwave retardation member 72 is made of a material having a dielectric constant greater than vacuum. The microwave retardation member 72 may be made of, e.g., quartz, ceramic, a fluorine-based resin such as polytetrafluoroethylene or the like, or a polyimide-based resin. The microwave has a long wavelength in the vacuum. The microwave retardation member 72 has a function of controlling a plasma by making the wavelength of the microwave shorter. The phase of the microwave changes depending on a thickness of the microwave retardation member 72. Therefore, the phase of the microwave can be controlled by the thickness of the microwave retardation member 72 such that the planar antenna 71 is located at a position of an antinode of a standing wave. Accordingly, the occurrence of the reflection wave at the planar antenna 71 can be suppressed and, also, the radiation energy of the microwave emitted from the planar antenna 71 can be increased. In other words, the microwave of an effective power can be introduced into the processing chamber 2.

The microwave transmitting plate 73 is made of a dielectric material. The dielectric material forming the microwave transmitting plate 73 may be, e.g., quartz, ceramic or the like. The microwave transmitting plate 73 has a shape that allows the microwave to be emitted effectively in a TE mode. In the example shown in FIG. 10, the microwave transmitting plate 73 has a rectangular parallepiped shape. However, the shape of the microwave transmitting plate 73 is not limited to the rectangular parallepiped shape and may also be, e.g., a cylindrical shape, a pentagonal columnar shape, a hexagonal columnar shape, and an octagonal columnar shape.

In the microwave introducing unit 63 configured as described above, the microwave amplified by the main amplifier 62C reaches the planar antenna 71 through the space (the microwave transmission line 68) between the inner peripheral surface of the main body 66 and the outer peripheral surface of the inner conductor 67, and then is emitted to the inner space of the processing chamber 2 through the microwave transmitting plate 73 from the slots 71a of the planar antenna 71.

The tuner 64 forms a slug tuner. Specifically, as shown in FIG. 9, the tuner 64 includes two slugs 74A and 74B provided at positions close to a base end side (upper end side) of the main body 66 compared to the antenna section 65, an actuator 75 for driving the two slugs 74A and 74B, and a tuner controller 76 for controlling the actuator 75.

The slugs 74A and 74B are formed in a plate shape or an annular shape and provided between the inner peripheral surface of the main body 66 and the outer peripheral surface of the inner conductor 67. The slugs 74A and 74B are made of a dielectric material, e.g., high-purity alumina having a relative dielectric constant of 10.

The tuner 64 vertically moves the slugs 74A and 74B by using the actuator 75 based on an instruction from the tuner controller 76 to adjust the impedance. For example, the tuner controller 76 adjusts the positions of the slugs 74A and 74B such that the impedance of the end portion becomes 50Ω.

In the present embodiment, the main amplifier 62C, the tuner 64, and the planar slot antenna 71 are arranged close to one another. Especially, the tuner 64 and the planar slot antenna 71 form a lumped constant circuit and serve as a resonator. The impedance mismatching up to the planar antenna 71 can be eliminated with high accuracy by the tuner 64, and the mismatching portion can be substantially used as a plasma space. Accordingly, the tuner 64 can control the plasma with high accuracy.

Figure 12:
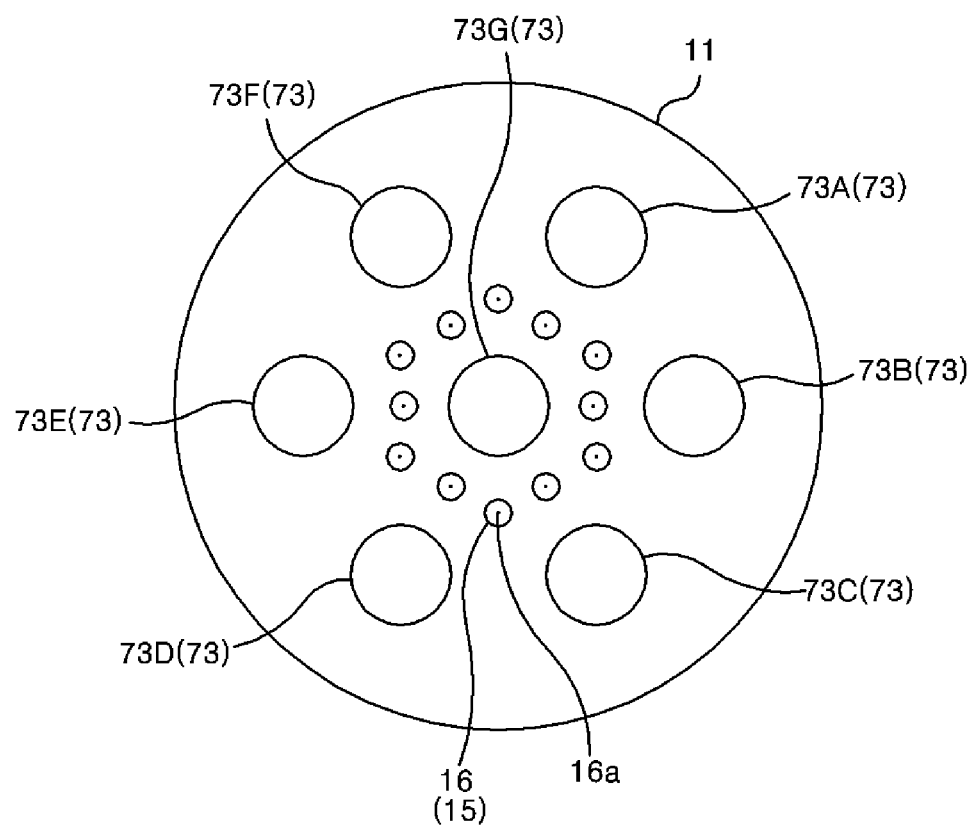
FIG. 12 is a bottom view of a ceiling portion of a processing chamber shown in FIG. 6.
Figure 13:
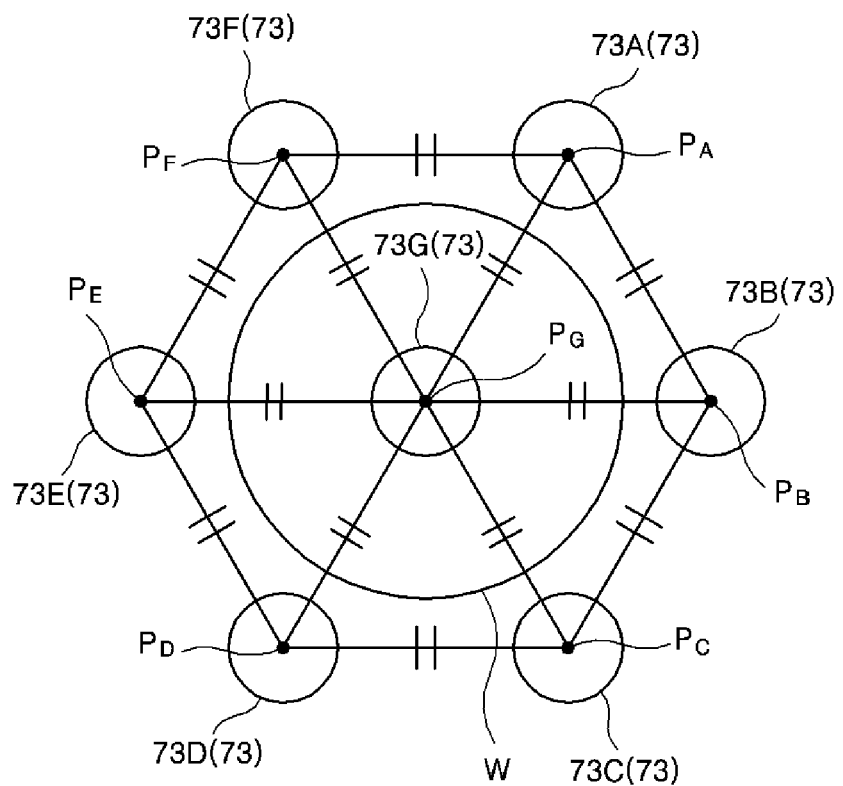
FIG. 13 is a view for explaining arrangement of a plurality of microwave transmitting plates in the microwave introducing unit shown in FIG. 6.

Hereinafter, the arrangement of the microwave transmitting plates 73 in the plasma processing apparatus 1 will be described with reference to FIGS. 12 and 13. FIG. 12 is a bottom view of the ceiling portion 11 of the processing chamber 2 shown in FIG. 6. FIG. 13 is a view for explaining the arrangement of the microwave transmitting plates 73 in the present embodiment. In FIG. 12, the illustration of the main body 66 is omitted. In the following description, it is assumed that the microwave transmitting plates 73 have a cylindrical shape.

The microwave introducing unit 5 includes a plurality of microwave transmitting plates 73. As described above, the microwave transmitting plates 73 correspond to the microwave transmitting windows of the present disclosure. The microwave transmitting plates 73 are provided on a single virtual plane in parallel with the mounting surface 21a of the mounting table 21 while being fitted to the respective openings of the ceiling portion 11 that is a conductive member of the microwave introducing unit 5. Further, the microwave transmitting plates 73 include three microwave transmitting plates 73 whose center points are spaced from each other by the same or substantially the same distance on the virtual plane. The expression that the distance between the center points is substantially the same means that the positions of the microwave transmitting plates 73 may be slightly deviated from desired positions in terms of the shape accuracy of the microwave transmitting plates 73, the assembly accuracy of the antenna modules 61 (the microwave introducing unit 63), or the like.

In the present embodiment, the microwave transmitting plates 73 include seven microwave transmitting plates 73 arranged in a hexagonal closest arrangement. Specifically, the microwave transmitting plates 73 include six microwave transmitting plates 73A to 73F arranged such that the center points thereof coincide or substantially coincide with vertices of a regular hexagon, and a single microwave transmitting plate 73G whose center point coincides or substantially coincides with the center of the regular hexagon. In FIG. 13, notations $P_A$ to $P_G$ indicate the center points of the microwave transmitting plates 73A to 73G, respectively. The expression that the center points of the microwave transmitting plates 73 substantially coincide with the vertices or the center point of the regular hexagon means that the center points of the microwave transmitting plates 73 may be slightly deviated from the vertices or the center point of the regular hexagon in terms of the shape accuracy of the microwave transmitting plates 73, the assembly accuracy of the antenna modules 61 (the microwave introducing unit 63), or the like.

As shown in FIG. 12, the microwave transmitting plate 73G is provided at a central portion of the ceiling portion 11. The six microwave transmitting plates 73A to 73F surround the microwave transmitting plate 73G at an outer side of the central portion of the ceiling portion 11. In the present embodiment, the central portion of the ceiling portion 11 indicates the central portion of the ceiling portion 11 which is seen from the top.

As shown in FIG. 13, the microwave transmitting plates 73A to 73G are arranged such that six equilateral triangles are formed on the plane by connecting three center points adjacent to one another among the center points $P_A$ to $P_G$ of the microwave transmitting plates 73A to 73G and a virtual regular hexagon is formed by the six equilateral triangles. In FIG. 13, a notation W indicates a figure obtained by projecting the shape of the wafer W which is seen from the top on the virtual plane where the microwave transmitting plates 73 are arranged (hereinafter, simply referred to as "planar shape of the wafer W"). In the example shown in FIG. 13, the wafer W has a circular planar shape. In the present embodiment, the planar shape of the wafer W is within the outer edges of the regular hexagon as the reference of the center points $P_A$ to $P_F$ of the microwave transmitting plates 73A to 73F. The center point $P_G$ of the microwave transmitting plate 73G coincides or substantially coincides with the center point of the planar shape (circle) of the wafer W. The center points $P_A$ to $P_F$ of the microwave transmitting plates 73A to 73F are arranged at a regular or a substantially regular interval on a circumference of a concentric circle with respect to the planar shape of the wafer W. In the present embodiment, distances between center points of three adjacent microwave transmitting plates 73 among the microwave transmitting plates 73 is the same or substantially the same.

As shown in FIG. 9, the microwave introducing unit 63 has an integrated structure including the microwave transmitting plate 73. In the present embodiment, a plurality of microwave introducing units 63 includes seven microwave introducing units 63. The microwave introducing units 63 are respectively arranged at positions corresponding to the positions of the microwave transmitting plates 73 shown in FIGS. 12 and 13. As shown in FIG. 12, a plurality of nozzles 16 of the gas inlet unit 15 surrounds the microwave transmitting plate 73G between the microwave transmitting plates 73A to 73F and the microwave transmitting plate 73G.

(Sequence of Plasma Oxidation Process)

In the step B, the plasma oxidation process using the plasma processing apparatus 1 is performed in the following sequence.

First, an instruction is inputted into the process controller 81 from the user interface 82, so that the plasma oxidation process can be performed in the plasma processing apparatus 1. Next, the process controller 81 reads out a recipe stored in the storage unit 83 or a computer-readable storage medium in response to the instruction. Then, control signals are sent from the process controller 81 to the respective end devices (e.g., the high frequency bias power supply 25, the gas supply unit 3a, the gas exhaust unit 4, the microwave introducing unit 5 and the like) of the plasma processing apparatus 1 so that the plasma oxidation process can be performed under the conditions based on the recipe.

Thereafter, the gate valve G is opened and the Ge substrate 200 as the wafer W is loaded into the processing chamber 2 through the gate valve G and the loading/unloading port 12a by the transfer unit (not shown). The wafer W is mounted on the mounting surface 21a of the mounting table 21. Next, the gate valve G is closed and the processing chamber 2 is depressurized by the gas exhaust unit 4. Then, a rare gas and an oxygen-containing gas as the processing gases are introduced into the processing chamber 2 at predetermined flow rates by the gas supply mechanism 3 through the gas inlet unit 15. The inner space of the processing chamber 2 is controlled to a predetermined pressure by controlling the gas exhaust amount and the gas supply amount.

Next, the microwave output unit 50 generates microwaves to be introduced into the processing chamber 2. The microwaves outputted from the distributor 54 of the microwave output unit 50 are inputted into the antenna modules 61 of the antenna unit 60 and introduced into the processing chamber 2 by the respective antenna modules 61. In each antenna module 61, the microwaves pass through the amplifier 62 and the microwave introducing unit 63. The microwaves that have reached the antenna section 65 of the microwave introducing unit 63 pass through the microwave transmitting plates 73 from the slots 71a of the planar antenna 71 to be emitted to a space above the wafer W in the processing chamber 2. In this manner, the microwaves are introduced into the processing chamber 2 from the respective antenna modules 61.

The microwaves introduced into the processing chamber 2 from a plurality of portions generate electromagnetic fields in the processing chamber 2. Accordingly, the rare gas or the oxygen-containing gas introduced into the processing chamber 2 is turned into a plasma. Active species, e.g., radicals or ions, in the plasma oxidize Ge at the interface between the Ge substrate 200 as the wafer W and the first high-k film 201. As a result, a thin $GeO_2$ film is formed.

When the control signals for terminating the plasma oxidation process are sent from the process controller 81 to the respective end devices of the plasma processing apparatus 1, the generation of the microwave is stopped and the supply of the rare gas and the oxygen-containing gas is stopped. Accordingly, the plasma oxidation process for the wafer W is terminated. Next, the gate valve G is opened and the wafer W is unloaded by the transfer unit.

In the plasma processing apparatus 1, it is possible to obtain uniform distribution of the microwave plasma density by allowing the center points of the adjacent microwave transmitting plates 73 to be spaced from each other by the same or substantially the same distance. Accordingly, the uniformity of the processing in the surface of the wafer W can be achieved.

In the plasma processing apparatus 1, the microwave transmitting plate 73G is provided at the central portion of the ceiling portion 11 and the six microwave transmitting plates 73A to 73F surround the microwave transmitting plate 73G at the outer side of the central portion of the celling portion 11. Accordingly, in the plasma processing apparatus 1, it is possible to obtain uniform distribution of the microwave plasma density over a wide range. Further, in the plasma processing apparatus 1, the antenna modules 61 have the same configuration. Therefore, in the plasma processing apparatus 1, the same plasma generation condition can be used in the respective antenna modules 61. Accordingly, the distribution of the microwave plasma density can be readily controlled. The plasma density below an area corresponding to the inside of the regular hexagon is greater than that below an area corresponding to the outside of the regular hexagon. In the present embodiment, as shown in FIG. 13, the outer edges of the regular hexagon as the reference of the center points of the microwave transmitting plates 73A to 73F include the planar shape of the wafer W. Accordingly, in the plasma processing apparatus 1, the wafer W can be disposed at a region where the plasma density is high.

In the present embodiment, the plasma oxidation process is performed at a low microwave power in order to form a high-quality Ge oxide film having a reduced interface state density and a high ratio of $GeO_2$ to GeO. In the plasma processing apparatus 1, since a plurality of microwave transmitting plates 73 is provided, an area of each microwave transmitting plate 73 can be reduced. When the microwave transmitting plate 73 of the plasma processing apparatus 1 has a cylindrical shape, a diameter of the planar shape of the microwave transmitting plate 73 may be within a range from, e.g., 90 mm to 200 mm, and preferably within a range from 90 mm to 150 mm. As a result, in the plasma processing apparatus 1, the power of the microwave which is required to stably ignite a plasma and sustain discharge can be reduced compared to the case of the plasma processing apparatus 1 for introducing a microwave from a single microwave transmitting plate. Accordingly, in the plasma processing apparatus 1, the ignition of plasma and the sustaining of discharge can be carried out by the low-power microwave. As a result, a Ge oxide film 202 having a thickness of, e.g., 0.3 nm or less, can be formed while controlling the film thickness.

(Conditions of Plasma Oxidation Process)

Hereinafter, main conditions for forming the Ge oxide film 202 while ensuring high controllability of the film thickness by using the plasma processing apparatus 1 in the step B will be described in detail. The main conditions include types of processing gases, flow rates of processing gases, a processing pressure, a microwave power, a processing temperature, and a processing time. These conditions are stored as recipes in the storage unit 83 of the control unit 8. The process controller 81 reads out the recipes and sends the control signals to the respective components of the plasma processing apparatus 1. Accordingly, the plasma oxidation process is performed under desired conditions.

<Types and Flow Rates of the Processing Gases>

As for the processing gases of the plasma oxidation process, it is preferable to use a rare gas for plasma generation and an oxygen-containing gas. The rare gas may be, e.g., Ar, Kr, Xe, He or the like. The oxygen-containing gas may be, e.g., $O_2$ gas, ozone gas, or the like. Especially, Ar gas and $O_2$ gas are preferably used as the rare gas and the oxygen-containing gas, respectively. A volume flow rate ratio of the oxygen-containing gas to the entire processing gas in the processing chamber 2 (flow rate ratio of oxygen-containing gas/entire processing gas) is preferably within a range from, e.g., 0.1% to 5% and more preferably within a range from 0.5% to 3%, in view of formation of a thin Ge oxide film 202 while ensuring a high controllability of a film thickness by appropriately controlling an oxidizing power. In the plasma oxidation process, the flow rate of the rare gas is preferably set within a range from, e.g., 100 ml/min(sccm) to 10000 ml/min(sccm), such that the above flow rate ratio can be obtained. The flow rate of the oxygen-containing gas is preferably set within a range from, e.g., 0.1 ml/min(sccm) to 500 ml/min(sccm), such that the above flow rate ratio can be obtained.

<Processing Pressure>

A processing pressure of the plasma oxidation process is preferably within a range from 6 Pa to 600 Pa and more preferably within a range from 50 Pa to 300 Pa, for example, in view of facilitation of formation of a thin film.

<Microwave Power>

In the plasma oxidation process using the plasma processing apparatus 1, it is preferable to use a microwave of 860 MHz. In the plasma oxidation process, the power density of the total power of the microwaves introduced through the microwave transmitting plates 73 is preferably within a range from 0.035 kW/m$^2$ to 3.5 kW/m$^2$ and more preferably within a range from 1.05 kW/m$^2$ to 2.8 kW/m$^2$ with respect to a total area of the ceiling portion 11 that is a conductive member facing the inner space of the processing chamber 2 and the microwave transmitting plates 73 in view of formation of the Ge oxide film 202 while ensuring a high controllability of the film thickness and realization of a high quality of the Ge oxide film 202. When the power density is lower than 0.035 kW/m$^2$, it is difficult to stably ignite a plasma and sustain discharge. On the other hand, when the power density is higher than 3.5 kW/m$^2$, a ratio of GeO to GeO$_2$ contained in the Ge oxide film 202 is increased. In that case, the quality of the Ge oxide film 202 is decreased and the oxidation rate is increased. Therefore, the controllability of the film thickness deteriorates considerably. For example, when the ceiling portion 11 facing the inner space of the processing chamber 2 has a diameter of 505 mm, it is preferable to set the power of the microwave introduced through a single microwave transmitting plate 73 within a range from 1 W to 100 W and more preferably within a range from 30 W to 80 W. In other words, when the microwaves are introduced into the processing chamber 2 through the microwave transmitting plates 73 of the seven microwave introducing units 5, the total power of the microwaves introduced through the seven microwave transmitting plates 73 is within a range from 7 W to 700 W.

<Processing Temperature>

A processing temperature of the wafer W in the plasma oxidation process is preferably set to be lower than, e.g., a room temperature, and more preferably within a range from, e.g., a room temperature (20° C.) to 145° C., in view of formation of the Ge oxide film 202 while ensuring a high controllability of a film thickness by decreasing an oxidation rate. When the processing temperature of the wafer W is lower than 20° C., the formation of the Ge oxide film 202 may be insufficient. When the processing temperature of the wafer W is higher than 145° C., it is difficult to form a thin Ge oxide film 202. The Ge oxide film 202 formed by the plasma oxidation process at the processing temperature of 145° C. or less has a high film quality. Therefore, when the insulating film laminated structure 204 is used as a gate insulating film, the gate leakage current can be reduced. The processing temperature indicates the temperature of the mounting table 21. The room temperature (20° C.) indicates no heating.

<Processing Time>

A processing time of the plasma oxidation process is not particularly limited as long as the Ge oxide film 202 having a desired thickness can be formed. However, the processing time of the plasma oxidation process is preferably within a range from, e.g., 10 sec to 500 sec and more preferably within a range from 10 sec to 150 sec, from the start of the supply of the microwave power for plasma ignition (power ON).

As described above, in the step B, a high-quality Ge oxide film 202 having a desired thickness of, e.g., 0.3 nm or less, can be formed at the interface between the Ge substrate 200 and the first high-k film 201 by performing the plasma oxidation process at a low power and a low temperature by using the plasma processing apparatus 1 in which a plasma is generated by a plurality of microwaves in the processing chamber 2

(Step D: Plasma Modification Process for Second High-k Film)

Figure 14:
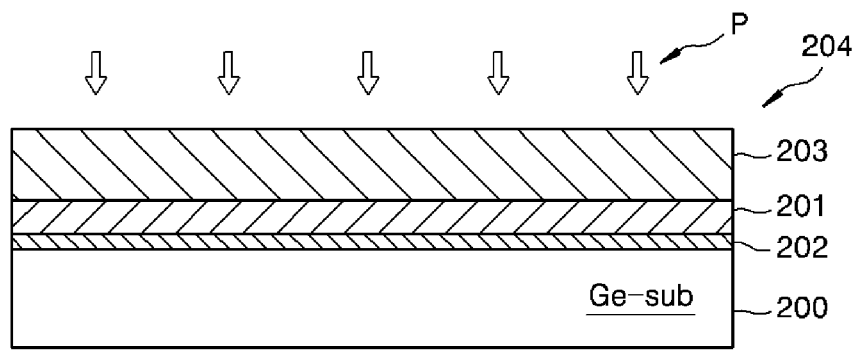
FIG. 14 is a cross sectional view showing the surface of the semiconductor substrate and its vicinity which explains a step after the step shown in FIG. 5.

The present embodiment may further include, as a step D, a step of performing a plasma modification process on the second high-k film 203. In other words, as shown in FIG. 14, after the second high-k film 203 is formed in the step C, the Ge substrate 200 is further processed by an oxygen-containing plasma P and the second high-k film 203 is modified. By performing the plasma modification process on the second high-k film 203, a dangling bond in the second high-k film 203 is terminated by an oxygen atom. At the same time, metal bonds such as Al—Al bond, Hf—Hf bond and the like are oxidized, thereby forming Al—O bond, Hf—O bond and the like. As a consequence, the film quality of the second high-k film 203 is modified. Therefore, when the insulating film laminated structure 204 is used as a gate insulating film of a transistor, the gate leakage current can be suppressed and the hysteresis characteristics can be improved.

(Condition of Plasma Modification Process)

The plasma modification process of the step D is preferably performed by using the plasma processing apparatus 1 having the same configuration as that of the plasma processing apparatus used in the step B. Hereinafter, main conditions of the plasma modification process performed on the second high-k film 203 by using the plasma processing apparatus 1 will be described in detail. The main conditions include types of the processing gases, flow rates of the processing gases, a processing pressure, a microwave power, a processing temperature, and a processing time. These conditions are stored as recipes in the storage unit 83 of the control unit 8. The process controller 81 reads out the recipes and sends the control signals to the respective components of the plasma processing apparatus 1. Accordingly, the plasma modification process is performed under desired conditions.

<Types and Flow Rates of Processing Gases>

As for the processing gases of the plasma modification process, it is preferable to use an oxygen-containing gas and a rare gas for plasma generation. The rare gas may be, e.g., Ar, Kr, Xe, He or the like. The oxygen-containing gas may be, e.g., $O_2$ gas, ozone gas, or the like. Especially, Ar gas and $O_2$ gas are preferably used as the rare gas and the oxygen-containing gas, respectively. A volume flow rate ratio of the oxygen-containing gas to the entire processing gas in the processing chamber 2 (flow rate ratio of oxygen-containing gas/entire processing gas) is preferably within a range from, e.g., 0.1% to 5% and more preferably within a range from 0.5% to 3%, by appropriately controlling an oxidizing power. In the plasma modification process, the flow rate of the rare gas is preferably set within a range from, e.g., 100 ml/min(sccm) to 10000 ml/min(sccm), such that the above flow rate ratio can be obtained. The flow rate of the oxygen-containing gas is preferably set within a range from, e.g., 0.1 ml/min(sccm) to 500 ml/min(sccm), such that the above flow rate ratio can be obtained.

<Processing Pressure>

A processing pressure of the plasma modification process is preferably within a range from 6 Pa to 600 Pa and more preferably within a range from 50 Pa to 300 Pa, for example, in view of improvement of the modification effect of the second high-k film 203.

<Microwave Power>

In the plasma modification process using the plasma processing apparatus 1, it is preferable to use a microwave of 860 MHz. In the plasma modification process, the power density of the total power of the microwaves introduced through the microwave transmitting plates 73 is preferably set within a range from 0.035 kW/m$^2$ to 3.5 kW/m$^2$ and more preferably within a range from 1.05 kW/m$^2$ to 2.8 kW/m$^2$ with respect to a total area of the ceiling portion 11 that is a conductive member facing the inner space of the processing chamber 2 and the microwave transmitting plates 73 in view of improvement of the modification effect for the second high-k film 203. When the power density is lower than 0.035 kW/m$^2$, it is difficult to stably ignite a plasma and sustain discharge. On the other hand, when the power density is higher than 3.5 kW/m$^2$, the Ge substrate 200 is reoxidized and the film thickness of the Ge oxide film 202 is considerably increased. Accordingly, the EOT is increased. For example, when the ceiling portion 11 facing the inner space of the processing chamber 2 has a diameter of 505 mm, it is preferable to set the power of the microwave introduced through a single microwave transmitting plate 73 within a range from 1 W to 100 W and more preferably within a range from 30 W to 80 W. In other words, when the microwaves are introduced into the processing chamber 2 through the microwave transmitting plates 73 of the seven microwave introducing units 5, the total power of the microwaves introduced through the seven microwave transmitting plates 73 is within a range from 7 W to 700 W.

<Processing Temperature>

A processing temperature of the wafer W in the plasma modification process is preferably set within a range from, e.g., 50° C. to 400° C. and more preferably within a range from 300° C. to 400° C., in view of improvement of the modification effect of the second high-k film 203 and in consideration of the heat resistance of the Ge substrate 200 or the like. In order to efficiently suppress the gate leakage current by enhancing the modification effect of the second high-k film 203, it is preferable to set the processing temperature of the plasma modification process to be higher than that of the plasma oxidation process of the step B. For example, the processing temperature of the plasma modification process is set to be higher than the processing temperature of the plasma oxidation process by 100° C. or more and preferably by 200° C. or more.

<Processing Time>

A processing time of the plasma modification process is not particularly limited as long as the modification effect for the second high-k film can be obtained. However, the processing time of the plasma modification process is preferably within a range from, e.g., 10 sec to 1000 sec and more preferably within a range from 30 sec to 500 sec, from the start of the supply of the microwave power for plasma ignition (power ON).

By performing the plasma modification process on the second high-k film 203 by using the plasma processing apparatus 1 as described above, the quality of the second high-k film 203 can be improved and the leakage current can be suppressed.

Hereinafter, test results on which the present disclosure is based will be described.

Test Example 1

The insulating film laminated structure 204 was manufactured under the following conditions by executing steps A to C.

In the step A, an $Al_2O_3$ film having a thickness of 1 nm was formed as the first high-k film 201 at a processing temperature of 200° C. on a p-type Ge substrate 200 that has been cleaned for five minutes by dilute hydrofluoric acid (about 1%) by an ALD method using trimethyl aluminum and $H_2O$ as materials.

In the step B, a Ge oxide film 202 having a thickness of 0.2 nm was formed on the interface between the Ge substrate 200 and the $Al_2O_3$ film serving as the first high-k film 201 by performing the plasma oxidation process on the laminated structure obtained in the step A under the following conditions by the plasma processing apparatus 1.

<Conditions of Plasma Oxidation Process>

Microwave power: a power of a microwave introduced through one single microwave transmitting plate 73 is 30 W (a total power of the microwaves introduced through the seven microwave transmitting plates 73 is 210 W, and the power density of the total power of the microwave with respect to a total area of the ceiling portion 11 facing the inner space of the processing chamber 2 and the microwave transmitting plates 73 is 1.05 kW/m$^2$).

Processing gas: Ar:O$_2$=990:10 [ml/min(sccm)]
Processing pressure: 133 Pa
Processing temperature and processing time: 120 sec at 50° C. or 30 sec at 300° C.

In the step C, an Al$_2$O$_3$ film having a thickness of 4 nm was formed as the second high-k film 203 on the Al$_2$O$_3$ film serving as the first high-k film 201 at a processing temperature of 200° C. by an ALD method using trimethyl aluminum and H$_2$O as materials.

Figure 15:
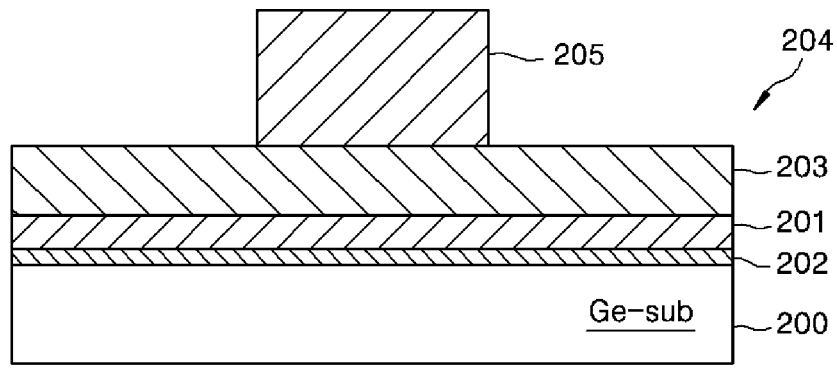
FIG. 15 explains a gate structure of a transistor manufactured in a test example.
Figure 16:
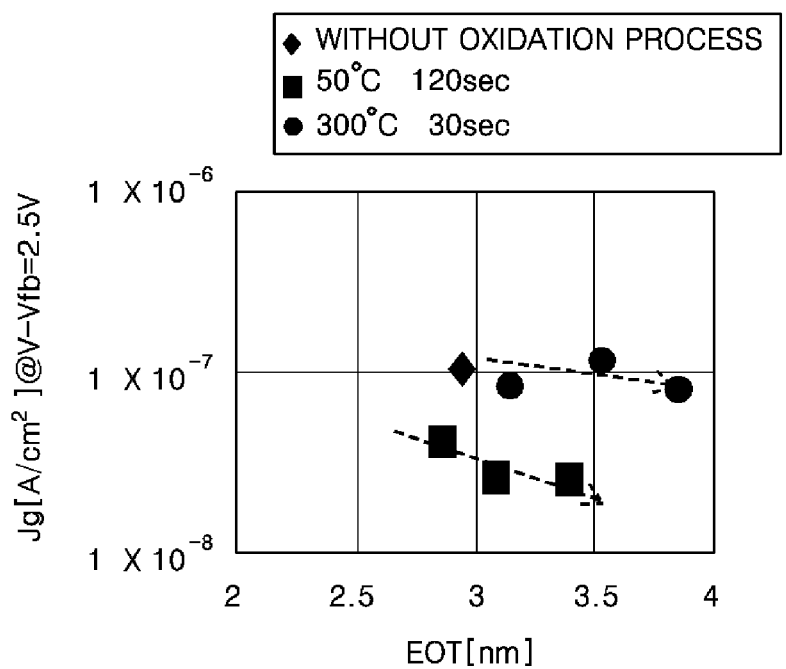
FIG. 16 shows measurement results of a gate leakage current Jg and EOT of a gate insulating film in a test example 1.
Figure 17:
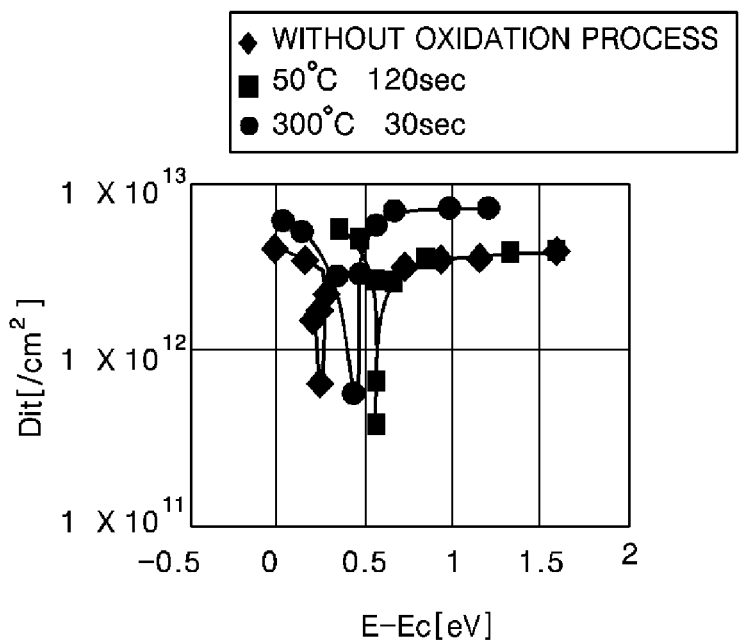
FIG. 17 shows a measurement result of an interface state density Dit in the test example 1.

The insulating film laminated body 204 thus manufactured serves as the gate insulating film. A TiN film having a thickness of 30 nm was formed on the insulating film laminated structure 204 by a PVD method. By etching the TiN film in a predetermined shape, a gate electrode 205 was formed as shown in FIG. 15. Then, a transistor having a gate structure shown in FIG. 15 was manufactured by performing sintering at 400° C. for 10 minutes under a hydrogen atmosphere (about 4%). In FIG. 15, the illustration of a source, a drain, a wiring and the like are omitted. FIG. 16 shows a relation between EOT of the gate insulating film and the gate leakage current Jg in the transistor thus manufactured. FIG. 17 shows a measurement result of the interface state density Dit. In FIGS. 16 and 17, a result obtained without performing the plasma oxidation process of the step B is also illustrated for comparison.

As can be seen from FIGS. 16 and 17, in the case of forming the Ge oxide film 202, the gate leakage current and the interface state density were more effectively reduced by performing the plasma oxidation process at 50° C. than at 300° C. Further, Dit obtained without performing the plasma oxidation process of the step B was 7.0×10$^{11}$/cm$^2$, whereas Dit obtained in the case of performing the plasma oxidation process of the step B at 50° C. was reduced to 3.5×10$^{11}$/cm$^2$. Moreover, EOT obtained without performing the plasma oxidation process of the step B was 2.94 nm, whereas EOT obtained in the case of performing the plasma oxidation process of the step B at 50° C. and EOT obtained in the case of performing the plasma oxidation process of the step B at 300° C. were 3.10 nm and 3.14 nm, respectively. In other words, the increase in the film thickness was only 0.2 nm or less.

Test Example 2

Figure 18:
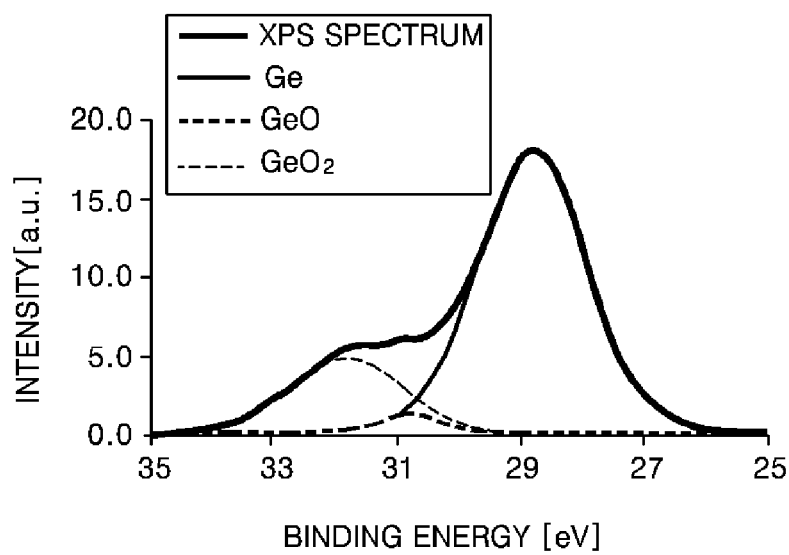
FIG. 18 shows an XPS (X-ray photoelectron spectroscopy) measurement result of a Ge oxide film in a test example 2.

The steps A and B were executed under the same conditions as those of the test example 1 except that the processing time of the step B was set to 30 sec and the microwave power and the processing temperature were changed. Accordingly, an Al$_2$O$_3$ film as the first high-k film 201 and the Ge oxide film 202 were formed on the Ge substrate 200. An elementary composition and a chemical bonding state of the Ge oxide film 202 were obtained by XPS (X-ray photoelectron spectroscopy). FIG. 18 shows a result obtained in the case of setting the power of the microwave introduced through one microwave transmitting plate 73 to 30 W and a processing temperature to 100° C.

As can be seen from FIG. 18, the Ge oxide film 202 contains GeO$_2$, GeO and Ge at a predetermined ratio. As the concentration of GeO$_2$ is increased, a gate insulating film having excellent electrical characteristics is obtained. The film thickness is related with the sum of GeO$_2$ and GeO. In this case, a binding amount related with the film quality was defined as (GeO$_2$/GeO) and a binding amount related with the film thickness was defined as (GeO+GeO$_2$)/Ge based on peak values of GeO$_2$, GeO and Ge (see FIG. 18). Then, the film quality and the film thickness of the Ge oxide film 202 which were obtained while varying the microwave power and the processing temperature were examined by the following Eq. (i).

$$\text{Peak value} = (\text{GeO}_2/\text{GeO})/((\text{GeO}+\text{GeO}_2)/\text{Ge}) \quad \text{Eq. (i)}$$

Figure 19:
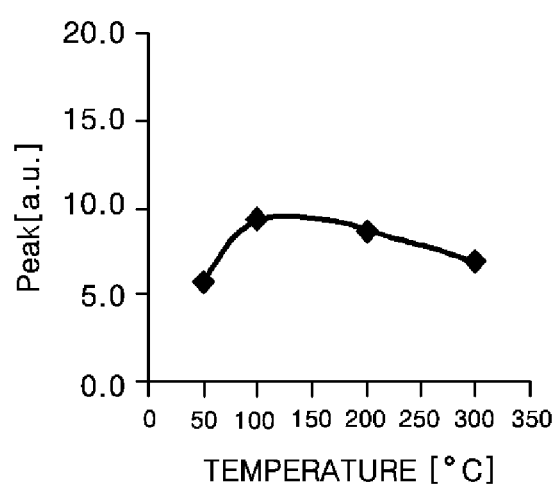
FIG. 19 shows a result obtained in the case of varying a temperature in the test example 2.
Figure 20:
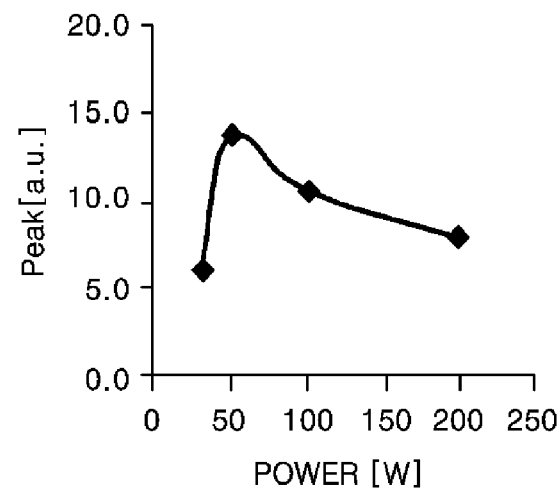
FIG. 20 shows a result obtained in the case of varying a microwave power in the test example 2.

FIG. 19 shows a result obtained in the case of fixing the microwave power to 30 W and varying the temperature to 50° C., 100° C., 200° C. and 300° C. FIG. 20 shows a result obtained in the case of fixing the temperature to 50° C. and varying the microwave power to 30 W, 50 W, 100 W and 200 W. The vertical axis in FIGS. 19 and 20 represents a normalization result of a value (Peak value) obtained in the Eq. (i). The microwave power indicates a power of a microwave introduced through one microwave transmitting plate 73 of the plasma processing apparatus 1. The total power of the seven microwaves is converted to the power density (with respect to a total area of the ceiling portion 11 facing the inner space of the processing chamber 2 and the respective microwave transmitting plates 73) as follows.

30 W×7=210 W ... power density 1.05 kW/m$^2$

50 W×7=350 W ... power density 1.7 kW/m$^2$

100 W×7=700 W ... power density 3.5 kW/m$^2$

200 W×7=1400 W ... power density 7.0 kW/m$^2$

As can be seen from FIGS. 19 and 20, the Peak value is highest at the processing temperature of about 100° C. to 150° C. and at the microwave power of about 50 W to 100 W. This indicates that a desired film quality and a desired film thickness of the Ge oxide film 202 are obtained under the above-described temperature and microwave power conditions.

Test Example 3

Figure 21:
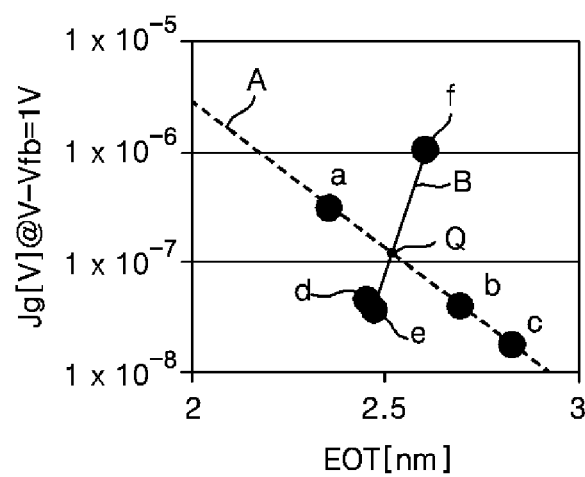
FIG. 21 shows measurement results of a gate leakage current Jg and EOT of a gate insulating film in the case of varying a processing temperature in a test example 3.
Figure 22:
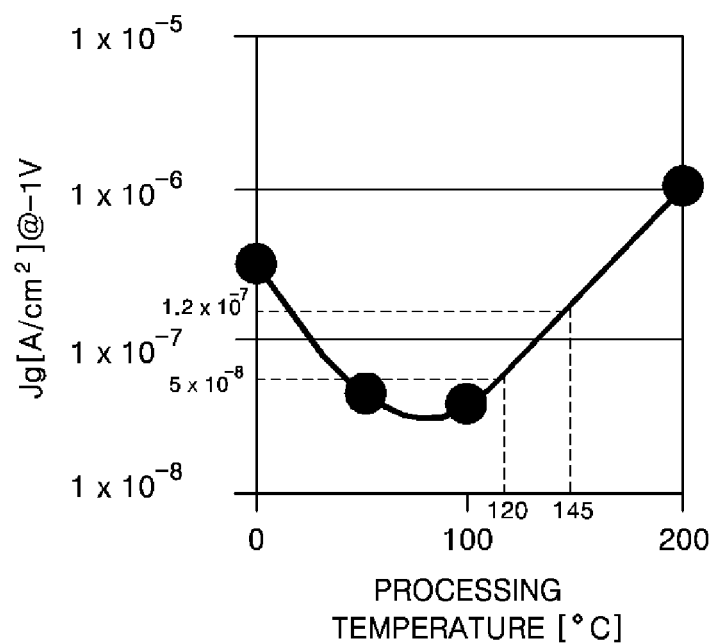
FIG. 22 shows a relation between the processing temperature and the gate leakage current Jg in the test example 3.
Figure 23:
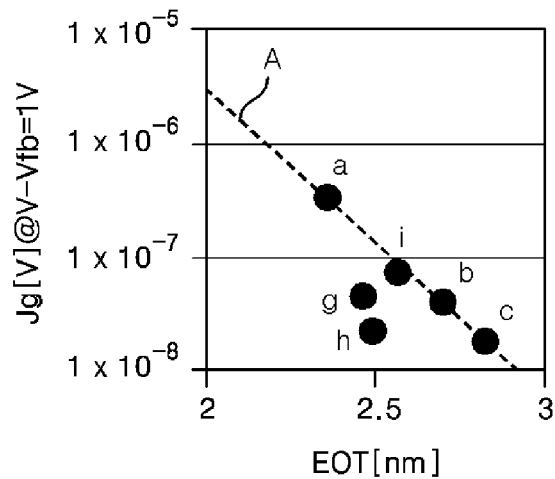
FIG. 23 shows measurement results of the gate leakage current Jg and EOT of a gate insulating film in the case of varying a microwave power in the test example 3.

The steps A to C were executed under the same conditions as those of the test example 1 except that the processing time, the processing temperature and the microwave power of the step B were changed. Accordingly, the insulating film laminated structure 204 was manufactured on the Ge substrate 200 and a transistor having a gate structure shown in FIG. 15 was manufactured. In order to examine the processing time dependency, the processing temperature dependency, and the microwave power dependency of the transistor, a relation between the EOT of the gate insulating film and the gate leakage current Jg was obtained. For comparison, the transistor manufactured under the same conditions as those of the test example 1 except that the plasma oxidation process of the step B was not performed was also examined. FIGS. 21 to 23 show the relation between the EOT of the gate insulating film and the gate leakage current Jg in the transistor thus manufactured. The microwave power in this test indicates a power of a microwave introduced through one single microwave transmitting plate 73 of the plasma processing apparatus 1. The total power of the microwaves introduced through the seven microwave transmitting plates 73 is converted to the power density (with respect to a total area of the ceiling portion 11 facing the inner space of the processing chamber 2 and the respective microwave transmitting plates 73) as follows.

30 W×7=210 W . . . power density 1.05 kW/m²

50 W×7=350 W . . . power density 1.7 kW/m²

100 W×7=700 W . . . power density 3.5 kW/m²

(Processing Time Dependency)

In order to examine the processing time dependency, the microwave power and the processing temperature in the step B were fixed to 30 W and 50° C., respectively, and the processing time in the step B was set to 120 sec or 360 sec. A dashed line A in FIGS. 21 and 23 is a straight line connecting a plot a obtained when the plasma oxidation process of the step B was not performed, a plot b obtained when the processing temperature was 120 sec, and a plot c obtained when the processing temperature was 360 sec. As can be seen from FIGS. 21 and 23, as the processing time increases, the EOT increases and Jg decreases. In FIGS. 21 and 23, in a lower left region of the dashed line A, EOT and Jg are low and a film quality is good. In an upper right region of the dashed line A, Jg is higher at the same EOT and a film quality is poor.

(Processing Temperature Dependency)

In order to examine the processing temperature dependency, the microwave power and the processing time of the step B were fixed to 30 W and 30 sec, respectively, and the processing temperature was varied to 0° C. (when the plasma oxidation process of the step B was not performed), 50° C., 100° C. or 200° C. FIGS. 21 and 22 are graphs showing the temperature dependency. In FIG. 21, a plot d shows a result obtained when the processing temperature was 50° C.; a plot e shows a result obtained when the processing temperature was 100° C.; a plot f shows a result obtained when the processing temperature was 200° C. In FIG. 21, a solid line B is a line connecting the plot e and the plot f and serves as a virtual line for obtaining a value of Jg at the intersection point Q between the dashed line A and the solid line B. In the case of applying the value (1.2 va$^{-7}$[A/cm²]) of JG at the intersection point Q (EOT 2.51 [nm]) between the dashed line A and the solid line B to the graph of FIG. 22, an upper limit of the processing temperature is 145° C. in view of suppression of Jg while reducing EOT. Further, when it is assumed that a desired value of Jg is $5\times10^{-8}$ [A/cm²] or less, a desired upper limit of the processing temperature is 120° C. as can be seen from FIG. 22.

(Microwave Power Dependency)

Figure 24:
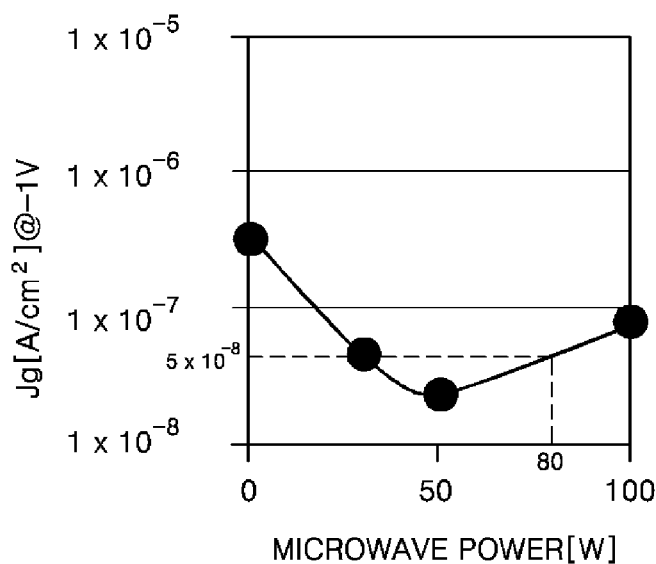
FIG. 24 shows a relation between a microwave power and a gate leakage current Jg in the test example 3.

In order to examine the microwave power dependency, the microwave power was varied to 0 W (when the plasma oxidation process of the step B was not performed), 30 W, 50 W or 100 W in a state where the processing temperature and the processing time of the step B were fixed to 50° C. and 30 sec, respectively. FIGS. 23 and 24 are graphs showing the microwave power dependency. In FIG. 23, a plot g shows a result obtained when the microwave power was 30 W; a plot h shows a result obtained when the microwave power was 50 W; a plot i shows a result obtained when the microwave power was 100 W. In FIG. 23, the plot i is slightly deviated from the dashed line A toward a lower left side. Therefore, an upper limit of the microwave power is 100 W in view of suppression of Jg while reducing EOT. Further, when it is assumed that a desired value of Jg is $5\times10^{-8}$[A/cm²] or less, a desired upper limit of the microwave power is 80 W (power density of 2.8 kW/m²) as can be seen from FIG. 24.

Test Example 4

Hereinafter, a result of a test that has proved the effect of the plasma modification process using the plasma processing apparatus 1 will be described.

The steps A to C were executed under the same processing conditions as those of the test example 1 except that the processing temperature and the processing time of the step B were respectively set to 300° C. and 360 sec. Then, the step D was executed under the following conditions. Accordingly, the insulating film laminated structure 204 was manufactured on the Ge substrate 200.

In the step D, the plasma modification process was performed on the $Al_2O_3$ film as the second high-k film 203 under the following conditions by the plasma processing apparatus 1.

<Conditions of Plasma Modification Process>

Microwave power: a power introduced through one microwave transmitting plate 73 is 30 W (a total power introduced through the seven microwave transmitting plates 73 is 210 W, and the power density of the total power of the microwave is 1.05 kW/m² with respect to a total area of the ceiling portion 11 facing the inner space of the processing chamber 2 and the microwave transmitting plates 73).

Processing gas: $Ar:O_2$=990:10 [ml/min(sccm)]

Processing pressure: 133 Pa

Processing temperature: 50° C. or 300° C.

Processing time: 30 sec, 120 sec or 360 sec

Figure 25:
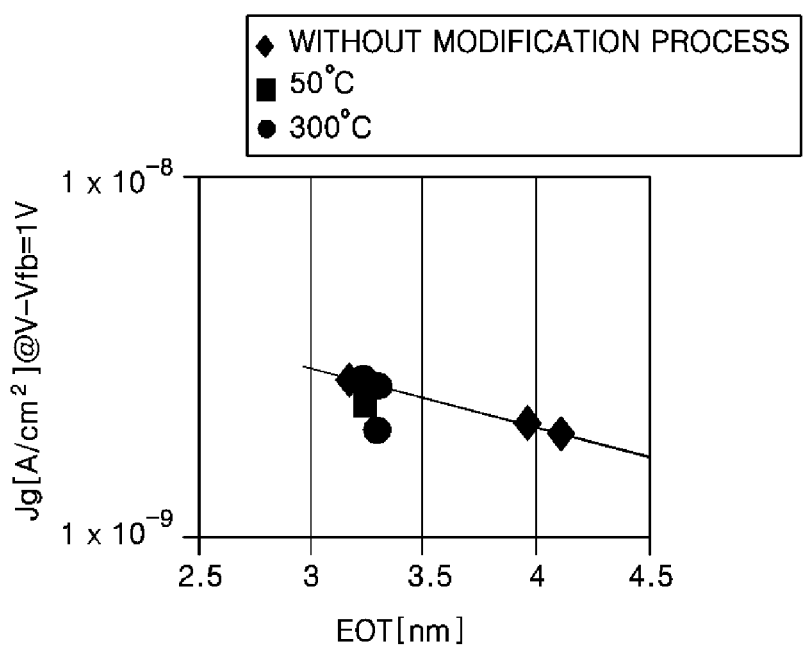
FIG. 25 shows a measurement result of a gate leakage current Jg and EOT of a gate insulating film in a test example 4.
Figure 26:
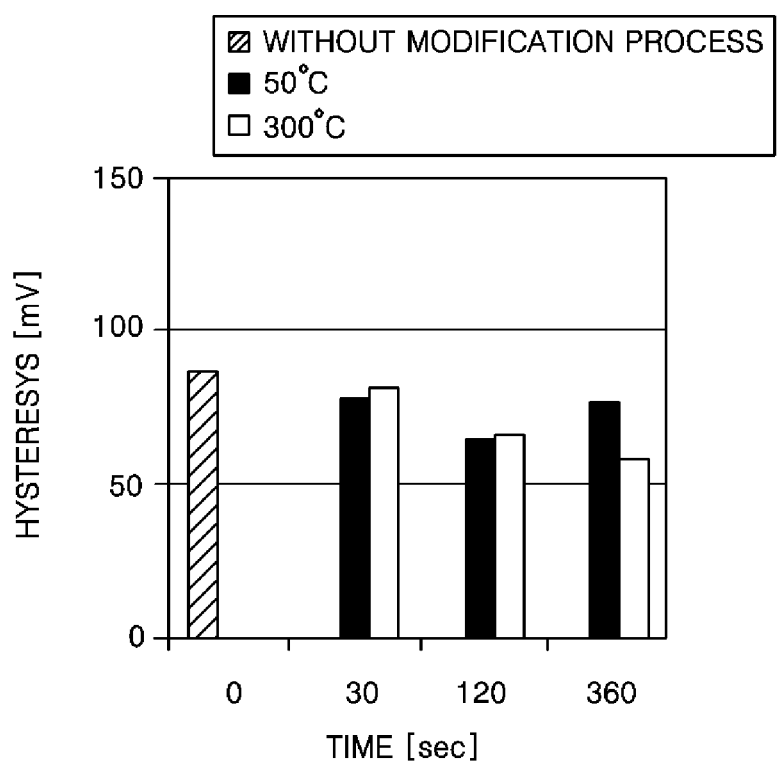
FIG. 26 shows a hysteresis measurement result in the test example 4.

The insulating film laminated body 204 thus manufactured serves as the gate insulating film. A TiN film having a thickness of 30 nm was formed on the insulating film laminated structure 204 by a PVD method. By etching the TiN film in a predetermined shape, a gate electrode 205 was formed as shown in FIG. 15. Then, a transistor having a gate structure shown in FIG. 15 was manufactured by performing sintering at 400° C. for 10 minutes under a hydrogen atmosphere (about 4%). In FIG. 15, the illustration of a source, a drain, a wiring and the like is omitted. FIG. 25 shows a relation between EOT of the gate insulating film and the gate leakage current Jg in the transistor thus manufactured. FIG. 26 shows hysteresis at that time. In FIGS. 25 and 26, a result obtained without performing the plasma modification process of the step D is also illustrated for comparison.

As can be seen from FIGS. 25 and 26, in the case of performing the plasma modification process of the step D, the gate leakage current was lower at the same EOT and the hysteresis was reduced. Further, the gate leakage current and the hysteresis were more efficiently reduced when the plasma modification process was performed at 300° C. compared to when the plasma modification process was performed at 50° C.

By performing the method for manufacturing an insulating film laminated structure of the present embodiment, an oxide film having a reduced interface state density and a small EOT can be performed on the surface of the wafer W as a target object. The insulating film laminated structure thus obtained is effectively used as, e.g., a gate insulating film of a transistor.

Second Embodiment

Hereinafter, a method for manufacturing an insulating film laminated structure according to a second embodiment which is performed by using the plasma processing apparatus 1 will be described. In the method for manufacturing an insulating film laminated structure of the second embodiment, instead of the plasma oxidation process in the step B of the first embodiment, a plasma nitriding process is performed on the wafer W as a target object by using the plasma processing apparatus 1. Hereinafter, differences between the first embodiment and the second embodiment will be described.

In the present embodiment, a Ge oxynitride film as an oxide film is formed with a desired thickness of, e.g., 0.3 nm or less, on the interface between the Ge substrate 200 and the first high-k film 201 by performing the plasma nitriding process on the wafer W as a target object by using the plasma processing apparatus 1. Oxygen atoms contained in the first high-k film 201 are extruded to the interface between the Ge substrate 200 and the first high-k film 201 by the action of the nitrogen plasma and mixedly exist in the Ge oxynitride film. Therefore, GeO, $GeO_2$, GeON and GeN exist together in the Ge oxynitride film.

(Conditions of Plasma Nitriding Process)

In the case of forming a Ge oxynitride film having a film thickness of, e.g., 1.0 nm and preferably within a range from 0.1 nm to 1.0 nm, on the interface between the Ge substrate 200 and the first high-k film 201 by using the plasma processing apparatus 1, main conditions may include types and flow rates of the processing gases, a processing pressure, a microwave power, a processing temperature and a processing time. These conditions are stored as recipes in the storage unit 83 of the control unit 8. The process controller 81 reads out the recipes and sends the control signals to the respective components of the plasma processing apparatus 1. Accordingly, the plasma nitriding process is performed under desired conditions.

<Types and Flow Rates of Processing Gases>

As for the processing gases of the plasma nitriding process, it is preferable to use a rare gas for plasma generation and a nitrogen-containing gas. The rare gas may be, e.g., Ar, Kr, Xe, He or the like. The nitrogen-containing gas may be, e.g., $N_2$ gas, $NH_3$ gas or the like. Especially, Ar gas and $N_2$ gas are preferably used as the rare gas and the nitrogen-containing gas, respectively. A volume flow rate ratio of the nitrogen-containing gas to the entire processing gas in the processing chamber 2 (flow rate ratio of nitrogen-containing gas/entire processing gas) is preferably within a range from, e.g., 10% to 30% and more preferably within a range from 15% to 20%, in view of formation of a thin Ge oxynitride film while ensuring a high controllability of a film thickness by appropriately controlling a nitriding power. In the plasma nitriding process, the flow rate of the rare gas is preferably set within a range from, e.g., 100 ml/min(sccm) to 10000 ml/min(sccm), such that the above flow rate ratio can be obtained. The flow rate of the nitrogen-containing gas is preferably set within a range from, e.g., 10 ml/min(sccm) to 3000 ml/min(sccm), such that the above flow rate ratio can be obtained.

<Processing Pressure>

A processing pressure of the plasma nitriding process is preferably within a range from, e.g., 1.3 Pa to 133 Pa and more preferably within a range from 5 Pa to 80 Pa, in view of facilitation of formation of a thin film.

<Microwave Power>

In the plasma nitriding process using the plasma nitriding process 1, it is preferable to use a microwave of 860 MHz. in the plasma nitriding process, the power density of the total power of the microwaves introduced through the microwave transmitting plates 73 is preferably within a range from 0.7 $kW/m^2$ to 21 $kW/m^2$ and more preferably within a range from 7.0 $kW/m^2$ to 14 $kW/m^2$ with respect to a total area of the ceiling portion 11 that is a conductive member facing the inner space of the processing chamber 2 and the microwave transmitting plates 73 in view of formation of the Ge oxynitride film while ensuring a high controllability of the film thickness and realization of a high quality of the Ge oxynitride film. When the power density is lower than 0.7 $kW/m^2$, it is difficult to stably ignite a plasma and sustain discharge. On the other hand, when the power density is higher than 21 $kW/m^2$, the quality of the Ge oxynitride film is decreased and the nitriding rate is increased. Therefore, the controllability of the film thickness of the Ge oxynitride film deteriorates considerably. For example, when the ceiling portion 11 facing the inner space of the processing chamber 2 has a diameter of 505 mm, it is preferable to set the power of the microwave introduced through one microwave transmitting plate 73 within a range from 20 W to 600 W and more preferably within a range from 200 W to 400 W. In other words, when the microwaves are introduced into the processing chamber 2 through the microwave transmitting plates 73 of the seven microwave introducing units 5, the total power of the microwaves introduced through the seven microwave transmitting plates 73 is within a range from 140 W to 4200 W.

<Processing Temperature>

A processing temperature of the wafer W in the plasma nitriding process is preferably set within a range from, e.g., 50° C. to 300° C. and more preferably within a range from 200° C. to 300° C., in view of formation of the Ge oxynitride film while ensuring a high controllability of a film thickness by decreasing a nitriding rate. When the processing temperature of the wafer W is lower than 50° C., the formation of the Ge oxynitride film may be insufficient. When the processing temperature of the wafer W is higher than 300° C., it is difficult to form a thin Ge oxynitride film. The Ge oxynitride film formed by the plasma nitriding process at the processing temperature of 300° C. or less has a high film quality. Therefore, when the insulating film laminated structure 204 is used as a gate insulating film, the gate leakage current can be reduced.

<Processing Time>

A processing time of the plasma nitriding process is not particularly limited as long as the Ge oxynitride film having a desired thickness can be formed. However, the processing time of the plasma nitriding process is preferably within a range from, e.g., 10 sec to 600 sec and more preferably within a range from 10 sec to 150 sec, from the start of the supply of the microwave power for plasma ignition (power ON).

By employing the insulating film laminated structure manufacturing method of the present embodiment, the insulating film laminated structure 204 having a small EOT and having a Ge oxynitride film as an oxide film having a reduced interface state density can be formed on the surface of the wafer W as a target object. The insulating film laminated structure 204 thus obtained is effectively used as, e.g., a gate insulating film of a transistor.

The other configurations and effects of the present embodiment are the same as those of the first embodiment.

The present disclosure is not limited to the above-described embodiments and may be variously modified. For example, in the above-described embodiments, a germanium substrate is used as the semiconductor wafer. However, it is also possible to use a germanium-containing material such as GeSn or the like instead of the germanium substrate. Or, a III-V group compound semiconductor substrate may be used. The III-V group compound semiconductor may be, e.g., InP, GaAs, InAs, AlSb, GaSb, InSb, InGaAs or the like. The germanium-containing material or the III-V group compound semiconductor may be formed as a partial layer of a substrate such as silicon or the like.

While the disclosure has been shown and described with respect to the embodiments, it will be understood by those skilled in the art that various changes and modifications may be made without departing from the scope of the disclosure as defined in the following claims.

What is claimed is:

1. A method for manufacturing an insulating film laminated structure on a semiconductor substrate, comprising:
forming a first high-k film on the semiconductor substrate;
processing the semiconductor substrate in a processing chamber of a plasma processing apparatus by using a plasma to form an oxide film on an interface between the semiconductor substrate and the first high-k film; and
forming a second high-k film on the first high-k film,
wherein the plasma processing apparatus includes:
the processing chamber configured to accommodate a semiconductor substrate;
a mounting table provided in the processing chamber and configured to mount thereon the semiconductor substrate;
a microwave output unit configured to generate microwaves and distribute and output the microwaves to a plurality of channels;
an antenna unit configured to introduce the microwaves outputted from the microwave output unit into the processing chamber;
a tuner configured to match an impedance between the microwave output unit and the processing chamber;
a conductive member provided at an upper portion of the processing chamber and having a plurality of openings facing the mounting table; and
a plurality of microwave transmitting windows fitted to the respective openings and configured to allow the microwave to be introduced into the processing chamber therethrough,
wherein the plasma is generated by the microwaves introduced into the processing chamber through the respective microwave transmitting windows, and
wherein the plasma processing is a plasma oxidation process that is performed by using a plasma of an oxygen-containing gas at a processing temperature of the semiconductor substrate in a range from 20° C. to 145° C. while setting a power density of a total power of the microwaves to be within a range from 0.035 kW/m$^2$ to 3.5 kW/m$^2$ with respect to a total area of the conductive member facing an inner space of the processing chamber and the microwave transmitting windows.

2. A method for manufacturing an insulating film laminated structure on a semiconductor substrate, comprising:
forming a first high-k film on the semiconductor substrate;
processing the semiconductor substrate in a processing chamber of a plasma processing apparatus by using a plasma to form an oxide film on an interface between the semiconductor substrate and the first high-k film; and
forming a second high-k film on the first high-k film,
wherein the plasma processing apparatus includes:
the processing chamber configured to accommodate a semiconductor substrate;
a mounting table, provided in the processing chamber, configured to mount thereon the semiconductor substrate;
a microwave output unit configured to generate microwaves and distribute and output the microwaves to a plurality of channels;
an antenna unit configured to introduce the microwaves outputted from the microwave output unit into the processing chamber;
a tuner configured to match an impedance between the microwave output unit and the processing chamber;
a conductive member provided at an upper portion of the processing chamber and having a plurality of openings facing the mounting table; and
a plurality of microwave transmitting windows fitted to the respective openings and configured to allow the microwave to be introduced into the processing chamber therethrough,
wherein the plasma is generated by the microwaves introduced into the processing chamber through the respective microwave transmitting windows, and
wherein the plasma processing is a plasma nitriding process that is performed by using a plasma of a nitrogen-containing gas at a processing temperature of the semiconductor substrate in a range from 50° C. to 300° C. while setting a power density of a total power of the microwaves to be within a range from 0.7 kW/m$^2$ to 21 kW/m$^2$ with respect to a total area of the conductive member facing an inner space of the processing chamber and the microwave transmitting windows.

3. The method of claim 1, further comprising, after said forming the second high-k film, further processing the semiconductor substrate by using the plasma by the plasma processing apparatus and modifying the second high-k film.

4. The method of claim 2, further comprising, after said forming the second high-k film, further processing the semiconductor substrate by using the plasma by the plasma processing apparatus and modifying the second high-k film.

5. The method of claim 3, wherein said modifying the second high-k film is performed at a processing temperature of the semiconductor substrate in a range from 50° C. to 400° C. while setting a power density of a total power of the microwaves to be within a range from 0.035 kW/m$^2$ to 3.5 kW/m$^2$ with respect to a total area of the conductive member facing the inner space of the processing chamber and the microwave transmitting windows.

6. The method of claim 4, wherein said modifying the second high-k film is performed at a processing temperature of the semiconductor substrate in a range from 50° C. to 400° C. while setting a power density of a total power of the microwaves to be within a range from 0.035 kW/m$^2$ to 3.5 kW/m$^2$ with respect to a total area of the conductive member facing the inner space of the processing chamber and the microwave transmitting windows.

7. The method of claim 1, wherein the oxide film has a thickness ranging from 0.1 nm to 1.0 nm.

8. The method of claim 2, wherein the oxide film has a thickness ranging from 0.1 nm to 1.0 nm.

9. The method of claim 3, wherein the oxide film has a thickness ranging from 0.1 nm to 1.0 nm.

10. The method of claim 4, wherein the oxide film has a thickness ranging from 0.1 nm to 1.0 nm.

11. The method of claim 1, wherein the first high-k film has a thickness ranging from 0.5 nm to 1.5 nm.

12. The method of claim 2, wherein the first high-k film has a thickness ranging from 0.5 nm to 1.5 nm.

13. The method of claim 3, wherein the first high-k film has a thickness ranging from 0.5 nm to 1.5 nm.

14. The method of claim 4, wherein the first high-k film has a thickness ranging from 0.5 nm to 1.5 nm.

15. The method of claim 1, wherein the first high-k film is a film containing an aluminum oxide.

16. The method of claim 2, wherein the first high-k film is a film containing an aluminum oxide.

17. The method of claim 1, wherein the second high-k film is a film containing one or more materials selected from a group consisting of $Al_2O_3$, $HfO_2$, $ZrO_2$, $TiO_2$ and a rare earth oxide.

18. The method of claim 2, wherein the second high-k film is a film containing one or more materials selected from a group consisting of $Al_2O_3$, $HfO_2$, $ZrO_2$, $TiO_2$ and a rare earth oxide.

* * * * *